(12) United States Patent
Angelov et al.

(10) Patent No.: US 8,371,567 B2
(45) Date of Patent: Feb. 12, 2013

(54) PEDESTAL COVERS

(75) Inventors: Ivelin Angelov, Sunnyvale, CA (US); Brian Severson, Chandler, AZ (US); Natan Solomon, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 119 days.

(21) Appl. No.: 13/086,010

(22) Filed: Apr. 13, 2011

(65) Prior Publication Data

US 2012/0264051 A1 Oct. 18, 2012

(51) Int. Cl.
*B23Q 3/00* (2006.01)
*H01L 21/306* (2006.01)
*C23F 1/00* (2006.01)

(52) U.S. Cl. ............... 269/289 R; 269/309; 156/345.52

(58) Field of Classification Search .................. 430/256; 269/289, 309; 156/345.52
See application file for complete search history.

(56) References Cited

U.S. PATENT DOCUMENTS

| | | |
|---|---|---|
| 3,612,825 A | 10/1971 | Chase et al. |
| 4,457,359 A | 7/1984 | Holden |
| 4,535,835 A | 8/1985 | Holden |
| 4,563,589 A | 1/1986 | Scheffer |
| 4,615,755 A | 10/1986 | Tracy et al. |
| 5,113,929 A | 5/1992 | Nakagawa et al. |
| 5,178,682 A | 1/1993 | Tsukamoto et al. |
| 5,228,208 A | 7/1993 | White et al. |
| 5,282,121 A | 1/1994 | Bornhorst et al. |
| 5,447,431 A | 9/1995 | Muka |
| 5,558,717 A | 9/1996 | Zhao et al. |
| 5,588,827 A | 12/1996 | Muka |
| 5,811,762 A | 9/1998 | Tseng |
| 6,072,163 A | 6/2000 | Armstrong et al. |
| 6,087,632 A | 7/2000 | Mizosaki et al. |
| 6,200,634 B1 | 3/2001 | Johnsgard et al. |

(Continued)

FOREIGN PATENT DOCUMENTS

| | | |
|---|---|---|
| JP | 62-229833 | 10/1987 |
| JP | 01-107519 | 4/1989 |

(Continued)

OTHER PUBLICATIONS

Shrinivasan et al., "Single-Chamber Sequential Curing of Semiconductor Wafers," Novellus Systems, Inc., U.S. Appl. No. 11/115,576, filed Apr. 26, 2005.

(Continued)

*Primary Examiner* — Amanda C. Walke
(74) *Attorney, Agent, or Firm* — Weaver Austin Villeneuve & Sampson LLP

(57) ABSTRACT

Examples of novel semiconductor processing pedestals, and apparatuses including such pedestals, are described. These pedestals are specifically configured to provide uniform heat transfer to semiconductor substrates and to reduce maintenance complexity and/or frequency. Specifically, a pedestal may include a removable cover positioned over a metal platen of the pedestal. The removable cover is configured to maintain a consistent and uniform temperature profile of its substrate-facing surface even though the platen's upper-surface, which supports the cover and is in thermal communication with the cover, may have a much less uniform temperature profile. The cover may be made from certain ceramic materials and shaped as a thin plate. These materials are resistant to the processing environments and maintain their thermal characteristics over many processing cycles. The cover can be easily removed from the platen and replaced with a new one without a need for major disassembly of the entire apparatus.

26 Claims, 14 Drawing Sheets

U.S. PATENT DOCUMENTS

| | | | |
|---|---|---|---|
| 6,214,184 B1 | 4/2001 | Chien et al. | |
| 6,228,438 B1 | 5/2001 | Schmitt | |
| 6,307,184 B1 | 10/2001 | Womack et al. | |
| 6,320,736 B1 | 11/2001 | Shamouilian et al. | |
| 6,394,797 B1 | 5/2002 | Sugaya et al. | |
| 6,413,321 B1 | 7/2002 | Kim et al. | |
| 6,467,491 B1 | 10/2002 | Sugiura et al. | |
| 6,544,340 B2* | 4/2003 | Yudovsky | 118/728 |
| 6,559,424 B2 | 5/2003 | O'Carroll et al. | |
| 6,563,092 B1 | 5/2003 | Shrinivasan et al. | |
| 6,563,686 B2* | 5/2003 | Tsai et al. | 361/234 |
| 6,639,189 B2 | 10/2003 | Ramanan et al. | |
| 6,860,965 B1 | 3/2005 | Stevens | |
| 6,895,179 B2 | 5/2005 | Kanno | |
| 6,899,765 B2 | 5/2005 | Krivts et al. | |
| 7,105,463 B2 | 9/2006 | Kurita et al. | |
| 7,138,606 B2 | 11/2006 | Kanno et al. | |
| 7,253,125 B1 | 8/2007 | Bandyopadhyay et al. | |
| 7,265,061 B1 | 9/2007 | Cho et al. | |
| 7,327,948 B1 | 2/2008 | Shrinivasan et al. | |
| 7,410,355 B2 | 8/2008 | Granneman et al. | |
| 7,576,303 B2 | 8/2009 | Natsuhara et al. | |
| 7,665,951 B2 | 2/2010 | Kurita et al. | |
| 7,845,891 B2 | 12/2010 | Lee et al. | |
| 7,941,039 B1 | 5/2011 | Shrinivasan et al. | |
| 7,960,297 B1 | 6/2011 | Rivkin et al. | |
| 7,981,763 B1 | 7/2011 | Van Schravendijk et al. | |
| 8,033,771 B1 | 10/2011 | Gage et al. | |
| 8,052,419 B1 | 11/2011 | Nordin et al. | |
| 2002/0117109 A1 | 8/2002 | Hazelton et al. | |
| 2002/0162630 A1 | 11/2002 | Satoh et al. | |
| 2003/0013280 A1 | 1/2003 | Yamanaka | |
| 2003/0113187 A1 | 6/2003 | Lei et al. | |
| 2004/0023513 A1 | 2/2004 | Aoyama et al. | |
| 2004/0060917 A1 | 4/2004 | Liu et al. | |
| 2004/0183226 A1 | 9/2004 | Newell et al. | |
| 2004/0187790 A1 | 9/2004 | Bader et al. | |
| 2005/0006230 A1 | 1/2005 | Narushima et al. | |
| 2005/0045616 A1 | 3/2005 | Ishihara | |
| 2005/0226793 A1 | 10/2005 | Sakakura et al. | |
| 2005/0258164 A1 | 11/2005 | Hiramatsu et al. | |
| 2006/0018639 A1 | 1/2006 | Ramamurthy et al. | |
| 2006/0075960 A1 | 4/2006 | Borgini et al. | |
| 2006/0081186 A1 | 4/2006 | Shinriki et al. | |
| 2007/0029046 A1 | 2/2007 | Li et al. | |
| 2007/0107845 A1 | 5/2007 | Ishizawa et al. | |
| 2007/0205788 A1 | 9/2007 | Natsuhara et al. | |
| 2007/0243057 A1 | 10/2007 | Shimada et al. | |
| 2008/0102644 A1 | 5/2008 | Goto et al. | |
| 2008/0134820 A1 | 6/2008 | Bjorck et al. | |
| 2009/0060480 A1 | 3/2009 | Herchen | |
| 2009/0142167 A1 | 6/2009 | Gage et al. | |
| 2009/0277472 A1 | 11/2009 | Rivkin et al. | |
| 2010/0270004 A1 | 10/2010 | Landess et al. | |
| 2011/0318142 A1 | 12/2011 | Gage et al. | |

FOREIGN PATENT DOCUMENTS

| | | |
|---|---|---|
| JP | 06/037054 | 2/1994 |
| JP | 07-090582 | 4/1995 |
| JP | 07/147274 | 6/1995 |
| JP | 08-316215 | 11/1996 |
| JP | 09-092615 | 4/1997 |
| JP | 2000-286243 | 10/2000 |
| JP | 2002-246375 | 8/2002 |
| JP | 2002-373862 | 12/2002 |
| JP | 2005/116655 | 4/2005 |
| KR | 2003/0096732 | 12/2003 |
| KR | 10-0836183 | 6/2008 |
| WO | 00/19492 | 4/2000 |
| WO | 02/11911 | 2/2002 |

OTHER PUBLICATIONS

U.S. Office Action mailed Oct. 3, 2007, from U.S. Appl. No. 11/115,576.
U.S. Final Office Action mailed May 2, 2008, from U.S. Appl. No. 11/115,576.
U.S. Office Action mailed Oct. 17, 2008, from U.S. Appl. No. 11/115,576.
Doble et al., "Concave Pedestal for Uniform Heating of Silicon Wafers," Novellus Systems, Inc., U.S. Appl. No. 11/546,189, filed Oct. 10, 2006.
U.S. Office Action mailed Jun. 16, 2008, from U.S. Appl. No. 11/546,189.
U.S.Final Office Action mailed Oct. 16, 2008, from U.S. Appl. No. 11/546,189.
U.S. Office Action mailed Jul. 18, 2006, from U.S. Appl. No. 11/184,101.
Notice of Allowance and Fee Due mailed Jan. 25, 2007, from U.S. Appl. No. 11/184,101.
Gage et al., "Transferring Heat in Loadlocks," Novellus Systems, Inc., U.S. Appl. No. 12/140,196, filed Jun. 16, 2008.
Rivkin et al., "Photoresist Stripping Method and Apparatus," Novellus Systems, Inc., U.S. Appl. No. 61/050,880, filed May 6, 2008.
U.S. Appl. No. 11/937,364, Office Action mailed Apr. 9, 2010.
U.S. Appl. No. 11/115,576, Office Action mailed Apr. 22, 2009.
U.S. Appl. No. 11/115,576, Office Action mailed Apr. 15, 2010.
U.S. Appl. No. 11/129,266, "Tailored profile pedestal for thermo-elastically stable cooling for heating of substrates", Landess et al., filed May 12, 2005.
U.S. Appl. No. 11/129,266, Office Action mailed Feb. 20, 2009.
U.S. Appl. No. 11/129,266, Office Action mailed Oct. 28, 2009.
U.S. Appl. No. 11/608,185, Office Action mailed Apr. 26, 2010.
U.S. Appl. No. 11/751,584, "Cast pedestal with heating element on coaxial heat exchanger", Shrinivasan et al., filed May 21, 2007.
U.S. Appl. No. 11/851,310, Office Action mailed Jun. 8, 2010.
International Search Report and Written Opinion for application No. PCT/US2009/067040, mailed Aug. 2, 2010.
U.S. Appl. No. 11/608,185, Office Action mailed Nov. 26, 2010.
U.S.Appl. No. 12/333,239, Final Office Action mailed Dec. 27, 2010.
Notice of Allowance for U.S. Appl. No. 11/851,310, mailed Jan. 5, 2011.
U.S. Appl. No. 11/937,364, Office Action mailed Dec. 27, 2010.
U.S. Appl. No. 12/333,239, Office Action mailed Mar. 9, 2011.
U.S. Appl. No. 12/333,239, Notice of Allowance mailed Jun. 27, 2011.
Notice of Allowance for U.S. Appl. No. 11/608,185, mailed Mar. 22, 2011.
U.S. Appl. No. 13/102,858, "Load Lock Design for Rapid Wafer Heating", Rivkin et al., filed May 6, 2011.
U.S. Appl. No. 13/102,858, Office Action mailed Aug. 8, 2011.
U.S. Appl. No. 13/227,160, "Minimum contact area wafer clamping with gas flow for rapid wafer cooling", Gage et al., filed Sep. 7, 2011.
U.S. Appl. No. 11/937,364, Notice of Allowance mailed Sep. 19, 2011.
U.S. Appl. No. 13/276,202, "Closed Loop Temperature Heat Up and Control Utilizing Wafer-To-Heater Pedestal Gap Modulation," Nordin et al., filed Oct. 18, 2011.
U.S. Appl. No. 12/435,890, Office Action mailed Dec. 28, 2011.
U.S. Appl. No. 12/140,196, Office Action mailed Jan. 4, 2012.
U.S. Appl. No. 13/102,858, Office Action mailed Jan. 23, 2012.
U.S. Appl. No. 12/749,170, Office Action mailed Feb. 6, 2012.
U.S. Appl. No. 61/122,308, "Conductively cooled process pedestal for wide temperature range process," Nieh et al., filed Dec. 12, 2008.
U.S. Appl. No. 12/435,890, Office Action mailed Apr. 12, 2012.
U.S. Appl. No. 13/370,579, "Single-chamber sequential curing of semiconductor wafers," Shrinivasan et al., filed Feb. 10, 2012.
WO patent application No. PCT/US2011/034819, International Search Report and Written Opinion mailed Apr. 6, 2012.

* cited by examiner

… (1) …

PEDESTAL COVERS

BACKGROUND

Damascene processing techniques are used in many modern integrated circuit manufacturing schemes because these techniques require fewer processing steps and generally offer higher yields than other methods. Damascene processing involves forming metal conductors on integrated circuits by depositing corresponding inlaid metal lines in trenches and vias in a dielectric layer. As part of Damascene processing, a layer of photoresist is deposited on a dielectric layer. The photoresist is a light-sensitive organic polymer, which can be "spun on" in a liquid form and dried to form a solid film. The photoresist is then patterned by passing light through a mask. This operation may be followed by plasma etching of the patterned photoresist (e.g., exposed portions of the dielectric layer) to form vias and trenches in the dielectric layer. The photoresist is then stripped, and any etch-related residues are removed before subsequent processing. Generally, photoresist stripping employs plasma formed from one or more processes gases, which may include oxygen or other oxidizing reagents. The highly reactive plasma etches the organic photoresist to form volatile components, which are evacuated from the processing chamber. Substrate temperature should be precisely control during this stripping process (for example, to avoid undesirable variations in etch rates).

SUMMARY

Examples of novel semiconductor processing pedestals and apparatuses including such pedestals are described. These pedestals are specifically configured to provide uniform heat transfer to semiconductor substrates and to reduce maintenance complexity and/or frequency. Specifically, a pedestal may include a removable cover positioned over a metal platen of the pedestal. The removable cover is configured to maintain a consistent and uniform temperature profile of its substrate-facing surface even though the platen's upper-surface, which supports the cover and is in thermal communication with the cover, may have a much less uniform temperature profile. The cover may be made from certain ceramic materials and shaped as a thin plate. These materials are resistant to the processing environments and maintain their thermal characteristics over many processing cycles. The cover can be easily removed from the platen and replaced with a new one without a need for major disassembly of the entire apparatus.

Provided is a pedestal for supporting a semiconductor substrate. The pedestal may be used in an apparatus for processing such substrates. The pedestal includes a metal platen and a removable cover positioned over the platen. The platen has an upper surface for providing heat to the semiconductor substrate through the cover. The cover is configured to distribute this heat and to provide substantially uniform heat transfer to the substrate, which is positioned over the substrate-facing surface of the cover during processing. The cover may be made from one or more ceramic materials, further described below, or some other materials suitable for processing environments and capable of providing substantially uniform heat transfer to the substrate.

The cover is positioned over the upper surface of the platen. The cover typically includes a platen-facing surface opposite of the substrate-facing surface. A substantial portion of the platen-facing surface may be in direct contact with the upper surface of the platen in the assembled and operational pedestal. Alternatively, the platen-facing surface may be positioned at a predetermined distance from the upper surface of the platen in the assembled and operational pedestal. This distance provides additional heat resistance between the cover and platen and may be used when the heat flux should be further restricted to provide more uniform heat distribution. In certain embodiments, a metal platen is made from one or more of the following materials: aluminum 6061, aluminum 7075, and aluminum 3003. A metal platen may include a heater arranged within the metal platen for heating the upper surface of the platen. The output of the heater may be sufficient to maintain the upper surface at a temperature of between about 100° C. and 450° C. or various more specific ranges as further described below.

In certain embodiments, a substrate-facing surface of the cover includes a set of supports for supporting a substrate above the substrate-facing surface at an average, predetermined distance. This distance may be between about 0.001 inches and 0.015 inches or, more specifically, between about 0.004 inches and 0.007 inches. The set of supports may include at least six individual supports arranged in two or more circular patterns. The center of these patterns may correspond to the center of the cover. In other embodiments, substrate supports are provided on the upper surface of the metal platen. These supports protrude through openings in the removable cover and extend above the substrate-facing surface of the cover. These supports are likewise configured to support a substrate above the substrate-facing surface of the cover at an average, predetermined distance from the surface. This distance may fall within the ranges listed above. Examples of these supports include ceramic balls (e.g., sapphire balls) positioned on the free ends of extensions attached to the metal platen. The cover openings may have an elongated shape extending radially from the center of the cover to accommodate for thermal expansion differences between the cover and platen.

In certain embodiments, a pedestal is configured such that the temperature profile of the substrate-facing surface is within less than about 3° C. for a 400° C. set temperature. The upper facing surface may have much larger temperature deviations at this operating regime. In some embodiments, a removable cover has a thickness of between about 0.075 inches and 0.500 inches. The platen-facing and substrate-facing surfaces of the cover may be parallel within less than about 0.002 inches deviation.

A removable cover may be made from one or more of the following ceramic materials: aluminum oxide, aluminum nitride, barium titanate, boron nitride, silicon aluminium oxynitride, silicon carbide, silicon nitride, magnesium silicate, titanium carbide, zinc oxide, and zirconium dioxide. In certain embodiments, a substrate-facing surface of the removable cover has an average emissivity of less than about 0.35. A platen-facing surface of the cover may have a surface roughness of less than 10 micro-inches. In the same or other embodiments, an upper surface of the metal platen has a surface roughness of less than 10 micro-inches. Polished surfaces generally provide better heat transfer due to the more extensive contact between the two surfaces.

In certain embodiments, a removable cover includes a guiding pin extending from a center of the platen-facing surface. During pedestal assembly, the guiding pin protrudes into a corresponding guiding recess in the upper surface of the metal platen in order to maintain the relative positions of the cover and platen. In the same or other embodiments, a removable cover includes two or more retaining posts extending from the platen-facing surface and into respective upper retaining cavities on the upper surface of the platen for securing the cover with respect to the platen in at least the vertical direction. A pedestal may also include two or more retaining keys extending into side retaining cavities of the platen and engaging with corresponding retaining posts of the cover. In these embodiments, the pedestal may also include corresponding retaining covers for insertion into the side retaining cavities and for covering the retaining keys inside the cavities.

In certain embodiments, a removable cover includes a cover edge protrusion extending above the substrate-facing surface of the cover. The cover edge protrusion is configured to capture an outer edge of the semiconductor substrate during processing. In other embodiments, a metal platen includes a platen edge protrusion extending above the substrate-facing surface of the cover. The platen edge protrusion is configured for capturing an outer edge of the substrate, and the removable cover is positioned within a cavity formed by the platen edge protrusion.

In certain embodiments, an upper surface of the metal platen includes one or more outgassing grooves. The grooves may have a depth of between about 0.005 inches and 0.025 inches. The grooves may include at least one groove extending radially and away from the center of the platen. The radial groove extends to an outer edge of the platen and is open to the chamber environment. The grooves may include at least one concentric groove in addition to the radial groove. The concentric groove overlaps with the radial outgassing grooves and allows gases to flow in between the two grooves. In certain embodiments, an upper surface of the platen has two concentric outgassing grooves evenly spaced between the center and the outer edge of the platen. The upper surface also has eight radial outgassing grooves extending between the center of the platen and outer edge.

Also provided is a removable cover that can be positioned on a metal platen during assembly of the pedestal, and using this pedestal for processing semiconductor substrates. The cover includes a substrate-facing surface for providing uniform heat transfer to a substrate positioned over the substrate-facing surface. The cover also includes a platen-facing surface for positioning on a metal platen of the pedestal or, more specifically, on an upper-surface of the platen. The cover may be made from various ceramic materials described above. In certain embodiments, the cover has multiple supports for supporting a substrate at a predetermined average distance above the substrate-facing surface.

Provided also is an apparatus for processing semiconductor substrates. The apparatus includes a chamber configured to receive a substrate, a plasma source for producing plasma in the chamber, and a pedestal for supporting and heating the substrate. The pedestal may include a metal platen having an upper surface. This surface may be heated and provide heat to the substrate through a removable cover positioned over this surface. The removable cover is configured to redistribute this heat and provide substantially uniform heat transfer to the substrate positioned over its substrate-facing surface. The apparatus may be a part of the system that also includes a stepper.

A method of stripping photoresist from semiconductor substrates is also provided. The method may involve positioning a substrate onto or over a pedestal in the semiconductor-processing chamber. The pedestal may include a metal platen having an upper surface for providing heat to the substrate through a removable cover positioned over this surface. The removable cover is configured to redistribute this heat and provide substantially uniform heat transfer to the substrate positioned over its substrate-facing surface. The method may proceed with removing some or all of the photoresist from the substrate and then moving the substrate away from the pedestal. These operations may be repeated for additional substrates. During processing, the pedestal may be heated to at least about 120° C. prior to providing substrates. At this temperature set point, the temperature profile of the substrate-facing surface may deviate by less than about 3° C. This uniform temperature profile ensures uniform heat transfer to the substrate during processing.

In certain embodiments, a method involves replacing a removable cover with a new cover after processing, for example, at least about 10,000 substrates using the original cover. In more specific embodiments, the original pedestal may be used to process at least about 100,000 substrates without the need for cover replacement. During processing, the cover may maintain its thermal characteristics including, for example, its emissivity, at substantially the same initial level.

The method may also involve conditioning a new cover prior to introducing another substrate for processing. Such conditioning may be used to stabilize emissivity characteristics of the new cover or, more specifically, emissivity of its substrate-facing surface. The method may also involve applying photoresist to the substrate, exposing the photoresist to light, patterning the photoresist as well as transferring the pattern to the semiconductor substrate, and selectively removing the photoresist from the semiconductor substrate.

These and other features are described further below with reference to the figures.

DETAILED DESCRIPTION OF EXAMPLE EMBODIMENTS

Figure 1:
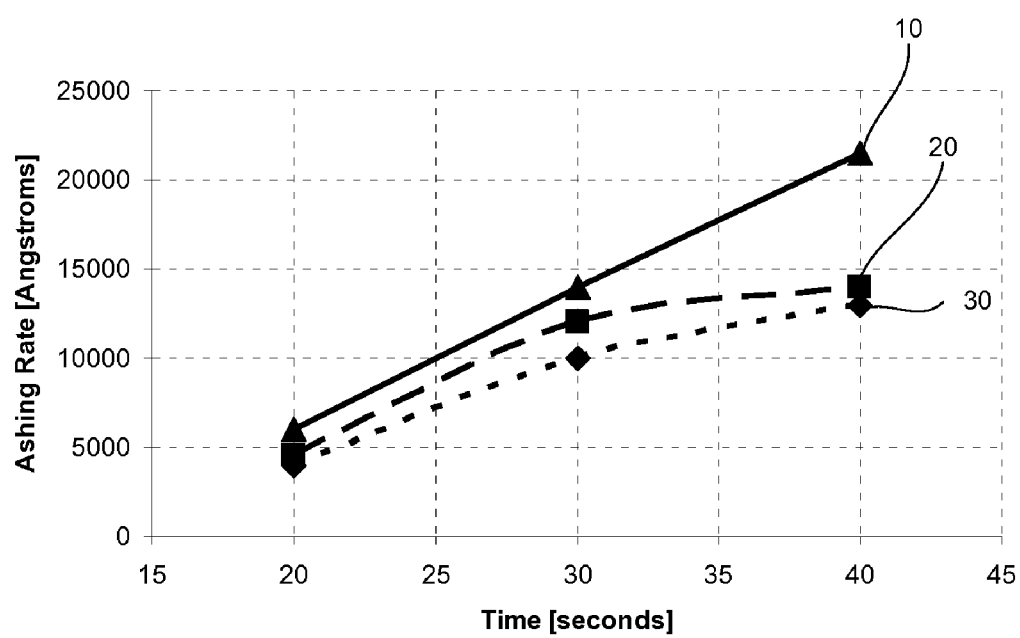
FIG. 1 is a plot of three ash rates as a function of processing time that illustrates experimental results using three different pedestals.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Semiconductor processing apparatuses may use pedestals for supporting semiconductor substrates during various processing operations performed on these substrates. These pedestals may be configured to heat and/or cool or, more generally, to control the temperature of the supported substrate. For example, a pedestal may be equipped with a heater positioned within its metal body and configured to provide a heat flux through its substrate-facing surface to the substrate. The substrate may be positioned at a predetermined distance (e.g., a few thousands of an inch) above the substrate-facing surface and may be heated by a combination of radiation and convection heat transfer methods. To achieve uniform heat transfer, the substrate-facing surface needs to be maintained as a uniform temperature (over its entire surface and/or during multiple processing cycles). Furthermore, the substrate-facing surface needs to have a uniform emissivity.

For purposes of this document, a substantially uniform temperature is defined as a temperature profile that has a deviation of less than some predetermined value. This value may be determined by various processing requirements. For example, for some ashing operations described below, this deviation may be less than about 5° C., or even less than about 2° C. As noted above, this temperature profile may be considered over the entire substrate-facing surface of the pedestal or, more specifically, over the surface portion actually designed to face a substrate during processing. Other portions, such as edge protrusions, may be ignored for purposes of constructing this temperature profile. Furthermore, uniformity of the profile may be considered within one processing cycle and over multiple cycles, such as at least about 10,000 cycles or even at least about 100,000 cycles. Semiconductor processes are validated for specific characteristics of the processing equipment. As such, shifts in these characteristics, including shifts in the temperature of the substrate-facing surface, should be minimized. A "substantially uniform heat transfer" is defined as a heat transfer provided by a pedestal-facing surface having a substantially uniform temperature profile. Furthermore, this surface should maintain substantially constant emissivity over a predetermined number of cycles. One having ordinary skills in the arts would appreciate specific requirements of a particular semiconductor process with respect to temperature and emissivity uniformity.

In this document, the terms "semiconductor substrate," "semiconductor wafer," "wafer," and "partially fabricated integrated circuit" are used interchangeably. One skilled in the art would understand that these terms may refer to various substrates, such as 200-millimeter wafers and 300-millimeter wafers, at various stages of integrated circuit fabrication processes. While the following detailed description may repeatedly refer to methods and apparatuses being implemented to process a silicon wafer, the scope is not so limited. Overall, semiconductor substrates may have various shapes, sizes, and materials. Some examples include printed circuit boards, displays, and the like. Pedestal structures or, more specifically, the various configurations of removable covers described herein, may be specifically modified to process such substrates.

Such apparatuses that include pedestals with removable covers may be used for various semiconductor fabrication processes, including, but not limited to, bulk stripping and/or high-dose implant stripping (HDIS) processes. The bulk stripping process may be used remove photoresist that has not been exposed to high dose ion implants and, as a result, does not have major crust formations on its surface. The HDIS process may be used to remove photoresist that has been exposed to high dose ion implants and, therefore, contains such crust formations. The HDIS process typically involves a staged approach with initial stripping stages, optimized for removing the crust in order to expose the bulk photoresist, followed by main stripping stages, optimized differently for removing the bulk photoresist. One or both stages in the HDIS process may use different process conditions than the bulk stripping process. For example, a bulk process may involve heating a substrate to at least about 250° C., for example to about 280° C., very rapidly. The ashing is then performed at this temperature in the presence of, for example, oxygen-containing plasma. In contrast, an HDIS process may start with heating a substrate to a lower temperature, for example, to between about 120° C. and 140° C. The oxygen-containing plasma is used to remove the crust while the substrate is kept at these lower temperatures. The substrate is then heated to at least about 250° C., for example to about 280° C., at which point the plasma ashes the underlying (and now exposed) bulk photoresist. These examples illustrate pedestals being exposed to chemical and thermal conditions, which may degrade their performance. Furthermore, the same pedestal may be used to provide different process conditions, such as different substrate temperatures, during the same HDIS process cycle. These process conditions often have a limited operating window that has to be maintained continuously over many processing cycles.

Some components of pedestals are often made from aluminum. Aluminum is a good material choice from both a cost and manufacturability perspective. Aluminum components may have protective coatings, such as a hard anodize. Some coatings may be used to provide specific performance characteristics, such as emissivity. Substrate-facing surfaces of pedestals typically need to have low emissivity. As such, bare aluminum surfaces are often used. However, these unprotected surfaces tend to deteriorate in harsh processing environments and change their surface characteristics.

It has been found in a series of experiments that substrate-facing surfaces often change their emissivity characteristics, which results in inconsistent and non-uniform heat transfer. Specifically, a pedestal made from aluminum 6061 was subjected to about 10,000 cycles of a typical bulk stripping process as described above. In a normal operating regime, an apparatus goes through that many cycles in only about a week. The substrate-facing surface of this pedestal was bare aluminum, and it was significantly discolored at the end of the test. The center of the pedestal was much darker than its edges. Without being restricted to any particular theory, it is believed that this grade of aluminum, which has a relatively high magnesium concentration, allows some of this magnesium to migrate to the substrate-facing surface. An emissivity map of the substrate-facing surface indicated that the darker center portion had an emissivity of about 0.15, while the lighter edge portions had an emissivity of only about 0.4. The emissivity of the original bare aluminum surface prior to the test was more than 0.4. Such deviations have a negative impact on the heat transfer, particularly on a portion of the heat flux transferred by radiation.

In a further experiment, three different pedestals were used to process multiple wafers using the same processing conditions. Processed wafers were then inspected to determine ashing rates corresponding to each pedestal. The results of this experiment are presented in FIG. 1 and illustrate substantially different ashing rates for different pedestals. It should be noted that ashing rates are very sensitive to substrate temperatures. Line 20 corresponds to a new pedestal made from aluminum 6061. Its surface did not have any visible discolorations. Line 30 corresponds to a new pedestal made from aluminum 3003. Its surface also did not have any visible discolorations. Finally, line 10 corresponds to a used pedestal made from aluminum 6061 that was previously subjected to about 10,000 ashing cycles. This pedestal had substantial discolorations of its substrate-facing surface, as described above. This pedestal produced much higher ashing rates, as evidenced from FIG. 1. Without being restricted to any particular theory, it is believed that a darker substrate-surface of this pedestal caused much higher radiation heat flux than in the other two pedestals. As a result, wafers were maintained at higher temperatures during processing, which resulted in much higher ashing rates. This ashing rate difference may not be acceptable in many instances, and the pedestal will have to be replaced. In other words, a pedestal may be used for only 10,000 cycles or even less before it has to be replaced.

Pedestal replacement is a very time consuming process, which may involve breaking various pressure/vacuum seals of the processing chamber and forming new seals. Pedestal replacement may require a new alignment of the pedestal with respect to other components, such as an internal substrate-handling robot and a load lock transfer mechanism. An entire pedestal also tends to be a very complex and expensive component. Frequent maintenance and replacement of pedestals should be avoided to the extent possible. At the same time, pedestals should maintain their heat transfer characteristics in between maintenance shutdowns, which may be difficult to accomplish with aluminum substrate-facing surfaces, as evidenced above. Furthermore, even a new aluminum pedestal may have substantial temperature variations on its substrate-facing surface.

It has been found that substantially uniform heat transfer can be consistently provided to a semiconductor substrate by positioning a specifically configured cover over a metal platen of the pedestal. This cover may be referred to as "a removable cover" as it can be easily removed from the platen and replaced with a new one, instead of replacing the platen. The cover is made from a chemically and temperature stable material that can operate within specific processing environments without deteriorating various thermal characteristics of the cover. Some of these materials may have a relatively low initial emissivity (after an initial "seasoning" cycle) and are capable of maintaining this emissivity substantially unchanged over a large number of cycles.

In certain embodiments, a removable cover is made from a material that has a thermal conductivity substantially lower than that of a corresponding metal platen. A ratio between these two thermal conductivities may be at least about 2 or even at least about 5. This lower thermal conductivity may help smooth any hot spots on the upper platen surface and avoid corresponding spots on the substrate-facing surface of the cover. In other words, the cover may be used as a thermal spreader.

Furthermore, a removable cover allows for the easy adjustment of thermal characteristics of the pedestal when, for example, the same pedestal is used to perform different types of processes that required different heating conditions. A removable cover may be easily replaced with another cover that has different heat transfer characteristics, or the pedestal may be left uncovered.

Overall, pedestals with removable covers may be configured to provide more stable and uniform heat transfer to and from substrates, and they are easier to maintain and operate.

Apparatus Examples

Figure 2:
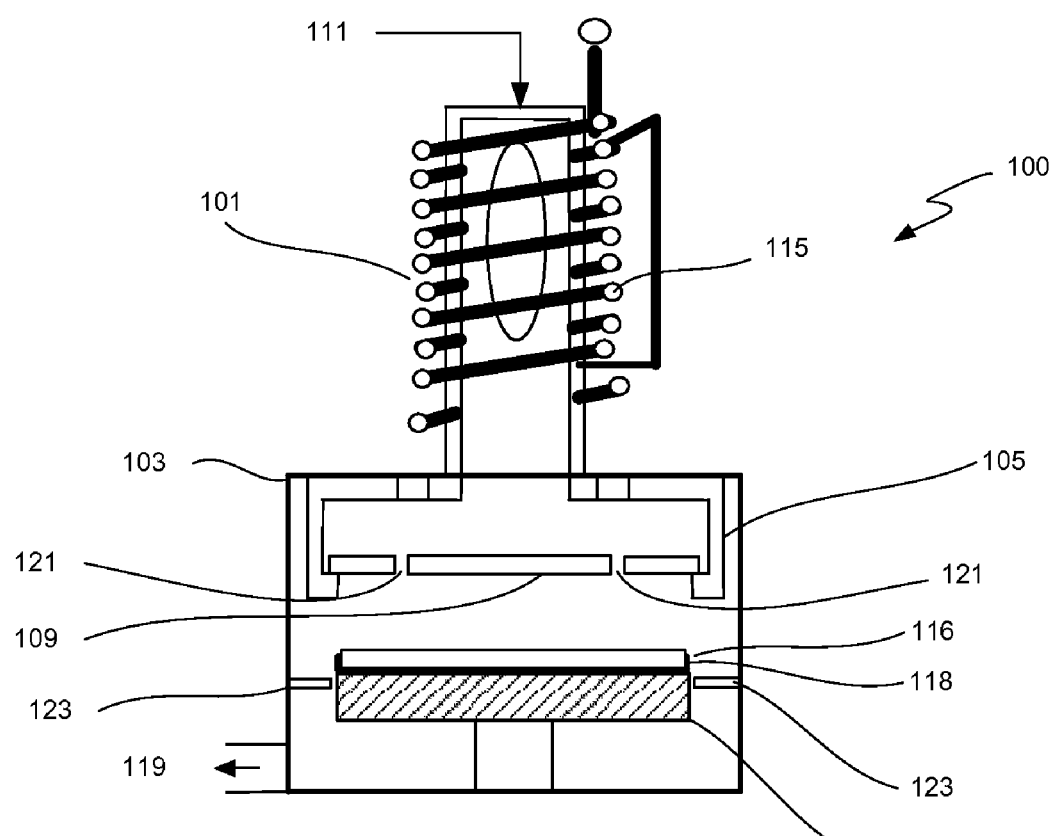
FIG. 2 is a schematic representation of a semiconductor processing apparatus including a removable cover, in accordance with certain embodiments.

To provide a better understanding and context to various features of pedestals having removable covers, a brief description of a processing apparatus is provided herein. FIG. 2 is a schematic representation of an apparatus 100 for processing semiconductor substrates, in accordance with certain embodiments. Apparatus 100 generally represents various types of equipment configured, for example, to remove photoresist materials and/or other residue materials from semiconductor substrates, as well conduct other semiconductor processing operations. Some specific examples include the GAMMA 2100, 2130 $I^2CP$ (Interlaced Inductively Coupled Plasma), G400, GxT, and the SIERRA, all of which are available from Novellus Systems in San Jose, Calif. Other systems include the FUSION line, which is available from Axcelis Technologies in Rockville, Md.; TERA21, which is available from PSK Tech in Korea; and ASPEN, which is available from Mattson Technology in Fremont, Calif. Some processing chambers containing pedestals with removable covers may be associated with cluster tools. For example, a strip chamber may be added to the CENTURA cluster tool, which is available from Applied Materials in Santa Clara, Calif.

Apparatus 100 has a plasma source 101 and a processing chamber 103, which may be separated from plasma source 101 by a showerhead assembly 105. Plasma source 101 is connected to a process gas inlet 111, which supplies one or more process gasses through showerhead assembly 105 into processing chamber 103. A low-pressure environment is attained in processing chamber 103 via the vacuum pump and conduit 119. A showerhead 109 forms the bottom of showerhead assembly 105. Processing chamber 103 encloses a pedestal that has a metal platen 117, and a removable cover 118 positioned over the upper surface of platen 117. The pedestal is used to support a semiconductor substrate 116 and, in certain embodiments, to heat and/or cool semiconductor substrate 116. As such, platen 117 may be fitted with a heating/cooling element. In some embodiments, platen 117 is also configured for applying a bias to semiconductor substrate 116.

During processing, one or more process gases are introduced via gas inlet 111 through plasma source 101. The gases may contain one or more chemically active species. Plasma source 101 may be used to ionize the gases in order to generate activated species and to form plasma. Plasma source 101 may be equipped with Radio Frequency (RF) induction coils 115. Showerhead 109 then directs this plasma into processing chamber 103 through showerhead holes 121. There may be any number and arrangement of the showerhead holes 121 to maximize the uniformity of the plasma/gas mixture and distribution towards the surface of semiconductor substrate 116.

Platen 117 may be temperature controlled and used for heating semiconductor substrate 116. In some embodiments, heat flux is transferred through removable cover 118. There may be some gap between removable cover 118 and semiconductor substrate 116 during processing. The gap may be provided by minimum contact area (MCA) supports, which are further described below with reference to FIG. 5A. In certain embodiments, some contact may be allowed between the substrate-facing surface of removable cover 118 and substrate 116. The gap may be increased by lowering the pedestal. When the pedestal is lowered, semiconductor substrate 116 is supported by pegs 123, which may be attached to the process chamber 103. In other embodiments, a fingers of the internal robot may support the semiconductor substrate while the platen is in the lowered position.

Some heat flux may be provided by thermal conduction. Some additional heat flux may be provided by radiation. The relative contributions of these two heat transfer methods depend on the size of the gap between removable cover 118 and substrate 116, emissivity of the substrate-facing surface of removable cover 118, pressure inside processing chamber 103, and other factors. In certain embodiments, thermal conduction is the largest contributor to the overall heat flux.

Pedestal Assembly

Figure 3A:
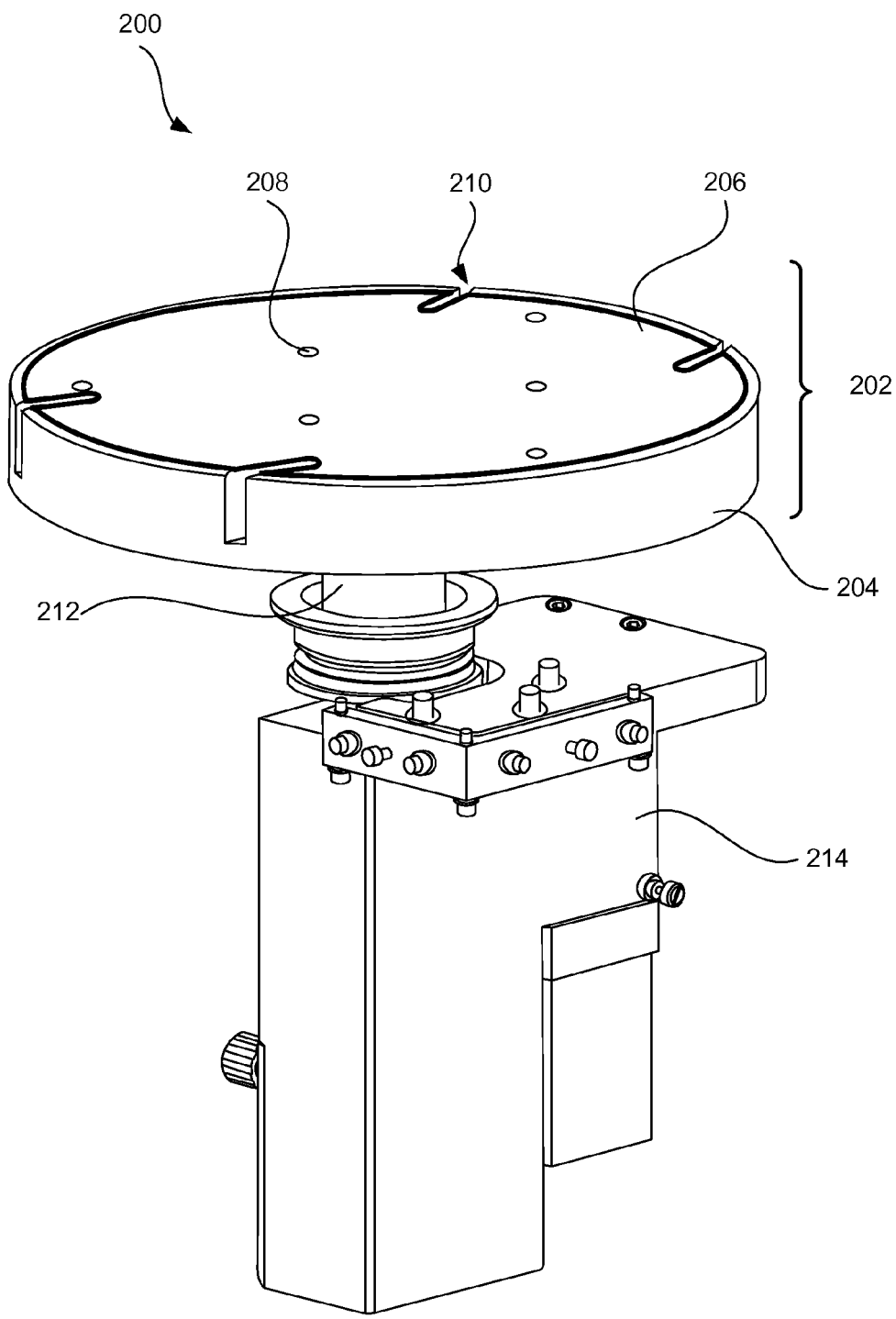
FIG. 3A is a perspective view of a pedestal having a metal platen and a removable cover positioned on the top of the platen, in accordance with certain embodiments.

FIG. 3A is a schematic representation of a pedestal 200 for use in a semiconductor processing apparatus, in accordance with certain embodiments. Some examples of such semiconductor processing apparatuses are described above and also further below in this document. A top portion 202 of pedestal 200 is used to support a semiconductor substrate (not shown). Top portion 202 is typically sized and shaped to accommodate a particular substrate type (e.g., a 300-mm wafer). In some embodiments, top portion 202 is substantially circular and has a diameter of between about 10 inches and 15 inches or, more specifically, between about 11 and 14 inches or, even more specifically, between about 12 and 13 inches (for example about 12.4 inches). Top portion 202 includes a metal platen 204 and a removable cover 206. The removable cover 206 is positioned on the top of metal platen 204 or, more specifically, on the upper surface (not visible) of platen 204. The removable cover 206 provides a surface (i.e., a substrate-facing surface) for receiving the substrate. The removable cover 206 also controls the heat flux between metal platen 204 and the substrate and, in certain embodiments, is configured to provide substantially uniform heating to the substrate. Arrangement of the metal platen 204 and removable cover 206 in pedestal 200 will now be described in more detail with reference to FIG. 3B.

Figure 3B:
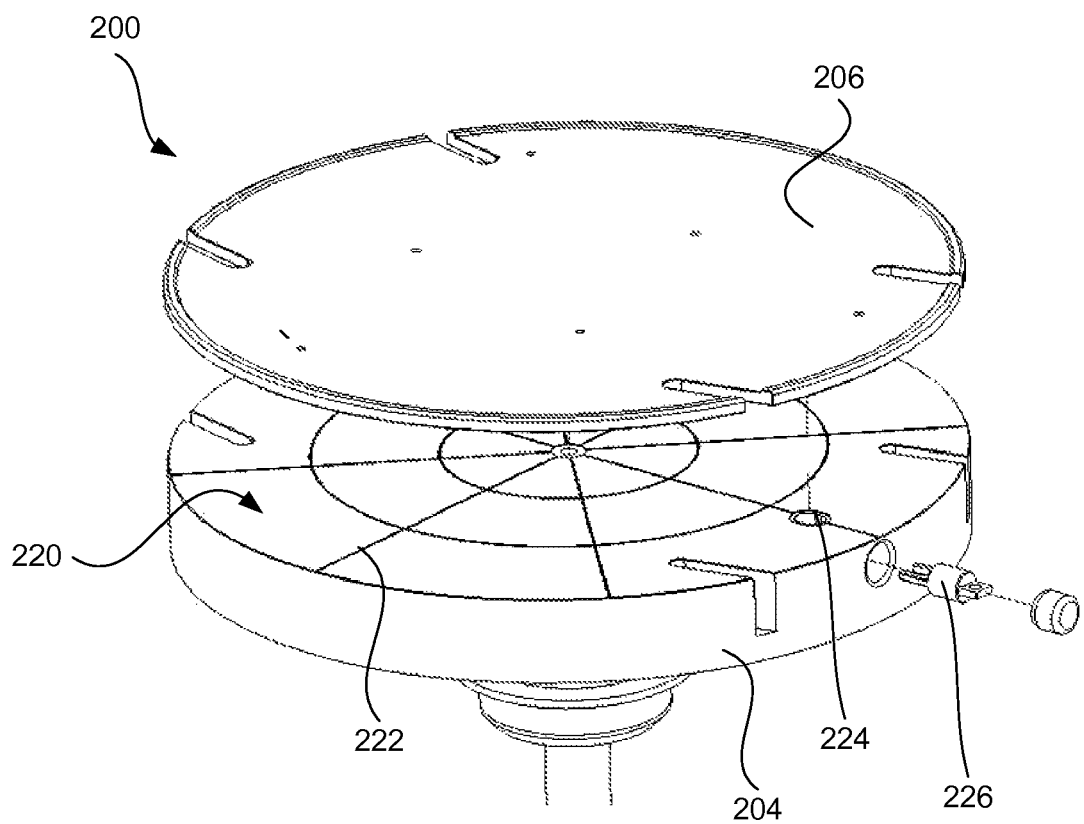
FIG. 3B is a perspective view of the pedestal prior to positioning the removable cover on the top of the metal platen, in accordance with certain embodiments.

Specifically, FIG. 3B shows pedestal 200 prior to positioning the removable cover 206 over metal platen 204. Metal platen 204 has an upper surface 220, which may be in direct contact with the platen-facing surface (not visible) of removable cover 206. In certain embodiments, upper surface 220 and/or platen-facing surface is polished to ensure better mechanical contact and heat transfer between the two surfaces. Upper surface 220 may include one or more outgassing grooves providing paths for gases to escape from pockets formed by upper surface 220 and the back side of removable cover 206 when the two are attached. In certain embodiment, removable cover 206 is elevated above metal platen 204, and a gap is formed between the platen-facing surface of cover 206 and upper surface 220 of platen 204. This gap may be used to increase the heat transfer resistance between metal platen 204 and removable cover 206. For example, a set of spacers may be positioned between these two components. The spacers may be part of removable cover 206, metal platen 204, other components (e.g., retaining mechanism), or standalone components.

As stated above, removable cover 206 may be used to provide substantially uniform heat transfer to a semiconductor substrate positioned over its substrate-facing surface. The heat is supplied by metal platen 204, which may be equipped with a heater. In certain embodiments, a heater is a resistive electrical heater, such as a current carrying coil in a metal tube arranged within one or more of the underside grooves of platen 204. The heating tube may be welded to platen 204. In other embodiments, a heater includes a heat exchanging fluid circulating through platen 204.

Returning to FIG. 3A, top portion 202 may include multiple protrusions 208 for supporting a semiconductor substrate at a distance from the substrate-facing surface of cover removable 206. These protrusions are sometimes referred to as MCA supports. MCA supports help to avoid large contact areas between the back side of the substrate and the substrate-facing surface of removable cover 206, which may damage and contaminate the back side. Furthermore, positioning the substrate slightly above the substrate-facing surface may help to provide more uniform heating of the substrate. MCA supports may be provided as a part of removable cover 206 or as a part of platen 204. Both embodiments are described further below.

Top portion 202 of pedestal 200 may have also multiple recesses 210 to accommodate internal wafer transfer robot fingers or chamber pegs. For example, FIG. 3A illustrates four recesses that may be used to accommodate two fingers provided on one arm and two other fingers provided on another arm of the internal robot. However, any number of recesses may be used. The fingers or pegs are used to support the substrate when top portion 202 of pedestal 200 moves into its lowered position. Top portion 202 is attached to shaft 212, which in turn is coupled to a lifting mechanism 214. Lifting mechanism 214 is configured to move top portion 202 in a vertical direction (i.e., the direction perpendicular to the substrate facing surface). This vertical motion allows the fingers or pegs to enter and leave the recesses 210. The lifting mechanism 214, heater, and other components of the pedestal assembly may be coupled to a control system of the apparatus, which is further described below.

Figure 4A:
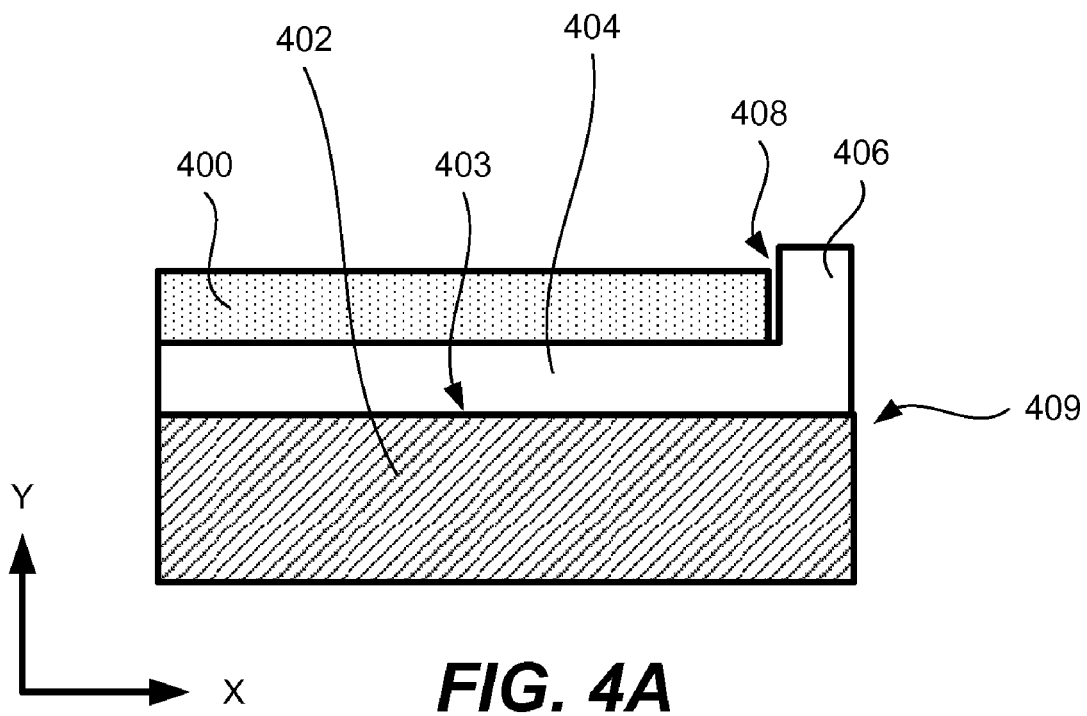
FIG. 4A is a schematic representation of a pedestal having an edge protrusion provided on a removable cover (i.e., a cover edge protrusion), in accordance with certain embodiments.
Figure 4B:
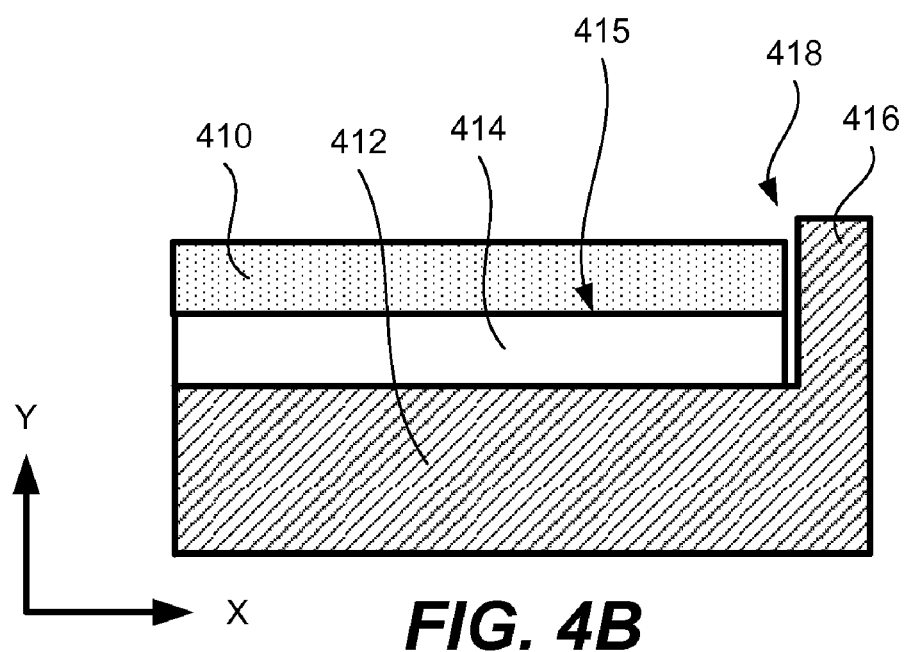
FIG. 4B is a schematic representation of a pedestal having an edge protrusion provided on a metal platen (i.e., a platen edge protrusion), in accordance with certain embodiments.

Top portion 202 may also include one or more edge protrusions for supporting a semiconductor substrate in the horizontal direction (i.e., in parallel to the substrate-facing surface). The edge protrusions may be provided on a metal platen, on a cover, or on both of these components. FIGS. 4A and 4B illustrate two schematic representations of different types of edge protrusions, in accordance with certain embodiments. Specifically, FIG. 4A illustrates an embodiment where an edge protrusion 406 is provided on a cover 404. This protrusion may be referred to as a cover edge protrusion. No protrusions are provided on a metal platen 402, which may have a substantially flat upper surface 403 that extends to an outside edge 409 of platen 402. Upper surface 403 may have outgassing grooves, some of which also extend to outside edge 409. This design may simplify manufacturing of the platen and allow for fabricating a smoother upper surface and closer tolerances.

In this configuration, substrate 400 is supported by cover edge protrusion 406. A small gap 408 may exist between substrate 400 and protrusion 406 to allow for positioning and removing the substrate, and to accommodate for thermal expansion differences between substrate 400 and cover 406 during processing. At the same time, gap 408 should be sufficiently small to maintain substrate alignment and to prevent collection of contaminant in the gap. In certain embodiments, an inside diameter of the cover edge protrusion is about 11.987 inches for supporting and/or aligning 300-millimeter wafers. Cover 404 is supported on metal platen 402 using various retaining features further, as described below.

FIG. 4B illustrates another embodiment where an edge protrusion 416 is provided on a metal platen 412. This protrusion is referred to as a platen edge protrusion 416. Cover 414 does not have any edge protrusions, which may simplify manufacturing of the cover 414 and allow for fabricating smoother cover surfaces and closer tolerances. Platen edge protrusion 416 is designed to extend above a substrate-facing surface 415 of cover 414. Therefore, the height of platen edge protrusion 416 depends on the thickness of cover 414. Generally, the distance that platen edge protrusion 416 extends above substrate-facing surface 415 of cover 414 is the same or comparable to the height of the cover edge protrusion described above with reference to FIG. 4A. To accommodate differences in thermal expansion of platen 412, cover 414, and substrate 410, and to allow the positioning of cover 414 and substrate 410 within the boundary formed by platen edge protrusion 416, a gap 418 is provided between platen edge protrusion 416 and cover 414, as well as between platen edge protrusion 416 and substrate 410. Cover 414 may be supported on metal platen 412 using various retaining features and/or platen edge protrusion 416.

Removable Cover

Accordingly, removable covers may be manufactured with or without cover edge protrusions. Covers with cover edge protrusions will now be described in more detail with reference to FIGS. 5A-5C. Another type of covers (i.e., covers without cover edge protrusions) will be described later with reference to FIGS. 6A-6B. One having ordinary skills in the art would understand that many features described with respect to one type of cover will be applicable to another type unless specifically noted otherwise. Therefore, for brevity, the description will be mostly focused on covers with cover edge protrusions.

Figure 5A:
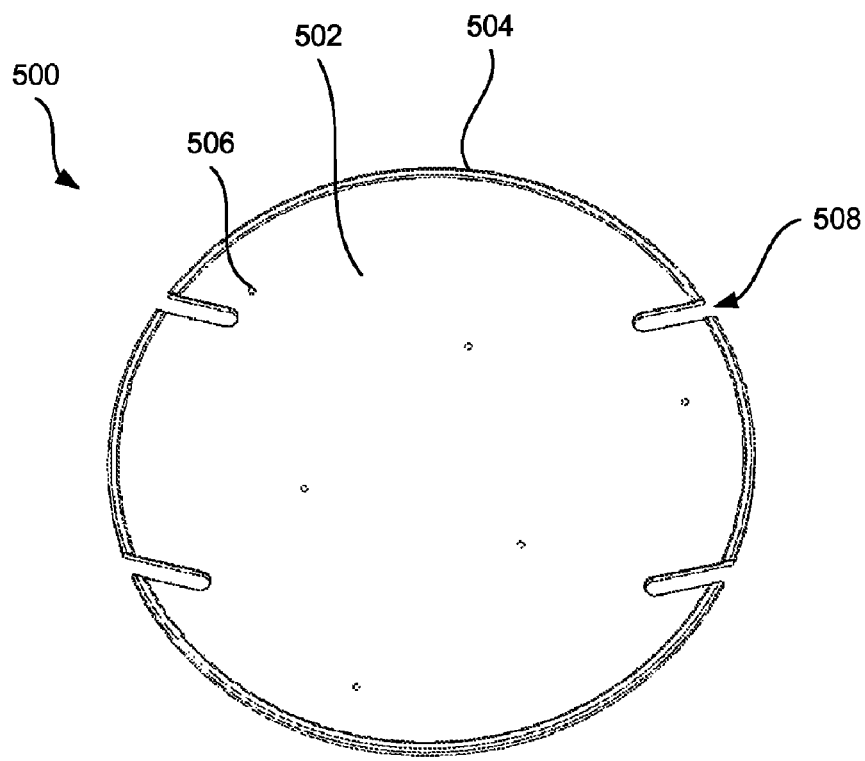
FIG. 5A is a top perspective view of a removable cover that illustrates its substrate-facing surface, in accordance with certain embodiments.

FIG. 5A is a top view of removable cover 500, in accordance with certain embodiments. Removable cover 500 has a substrate-facing surface 502, which is enclosed within a boundary defined by cover edge protrusion 504. In other embodiments where the cover does not have edge protrusions, the substrate-facing surface may be defined by an outer edge of the cover. Removable cover 500 also includes multiple recesses 508, which are configured to accommodate internal transfer robot fingers or chamber pegs. Recesses 508 are aligned with corresponding recesses on the metal platen during assembly of the pedestal. This alignment may be preserved by a retaining mechanism further described below.

Substrate-facing surface 502 is shown to have multiple MCA supports 506. MCA supports may be standalone components, such as sapphire balls positioned within recesses of the cover (or the platen), or integrated into the cover (or the platen). The height of MCA supports extending above the substrate-facing surface may be specifically selected to control heat transfer and to prevent excessive contact between the substrate and the surface. In certain embodiments, this height is between about 0.001 inches and 0.010 inches or, more specifically, between about 0.004 inches and 0.007 inches. This height creates a gap between the back side of the substrate and substrate-facing surface 502 of the removable cover 500. In certain embodiments, substrates may sag in between these MCA supports and even touch the substrate-facing surface. Therefore, the gap is generally referred to as an average gap. This average gap may be less than the height of MCA supports extending above the substrate-facing surface.

FIG. 5A shows six MCA supports 506 uniformly positioned throughout the entire substrate-facing surface of removable cover 500. Uniform positioning is needed to minimize substrate sagging, especially when the substrate is heated to relatively high processing temperatures. However, a different number of MCA supports (e.g., 3 to 25) may be used. In certain embodiments, a pedestal has no supports, and a substrate is positioned directly onto and in contact with the substrate-facing surface.

Six supports illustrated in FIG. 5A are uniformly disposed along two concentric circles (i.e., a first set of three supports disposed along an inner circle and a second set of three supports disposed along outer circle). The centers of these circles may substantially coincide with the center of the removable cover 500. Supports within each of these two sets may be offset by about 120° with respect to each other to provide uniform distribution. Supports in one set may be offset with respect to supports in another set by about 60°. Diameters of these circles depend on the size of the substrate-facing surface. For example, a pedestal used for supporting a 300-millimeter wafer may have an inner circle diameter of between about 4 inches and 6 inches (for example, about 5 inches), and an outer circle diameter of between about 9 inches and 11 inches (for example, about 10 inches).

A removable cover is made from a chemical and temperature resistant material that has particular thermal characteristics suitable for providing uniform heat transfer. Some examples of thermal characteristics include a heat transfer coefficient, specific heat, and emissivity. These characteristics should remain substantially stable while used in typical operating environments over a reasonably large number of cycles. Some initial pre-processing (e.g., "seasoning," or "burn in") of the cover may be performed to ensure subsequent stability. For example, a cover may be subjected to one or more processing cycles without any substrates positioned over its substrate-facing surface to adjust its emissivity characteristics.

Examples of materials suitable for removable covers include various ceramic materials, such as aluminum oxide, aluminum nitride, barium titanate, boron nitride, silicon aluminium oxynitride, silicon, silicon oxide, silicon carbide, silicon nitride, magnesium silicate, titanium carbide, zinc oxide, and zirconium dioxide. In a specific embodiment, a cover is made from aluminum oxide or, more specifically, from at least about 99.5% pure aluminum oxide or, even more specifically, from at least about 99.9% pure aluminum oxide. High purity levels help to avoid outgassing and particle formation when the cover is later exposed to the processing. The 99.5% and 99.9% purity levels are also applicable to the other ceramic materials listed above.

Materials for removable covers may be also characterized based on their thermal characteristics. In certain embodiments, a cover material has a heat transfer coefficient (at the room temperature) of less than about 100 W/(m K) or, more specifically, less than about 50 W/(m K), or even less than about 25 W/(m K). As previously stated, low heat transfer coefficients may help with "thermal spreading" and avoiding hot spots on the substrate-facing surface of the removable cover.

Another characteristic for characterizing removable covers is emissivity of their substrate-facing surfaces. This characteristic may depend on the material, the surface finish, and other factors. In certain embodiments, an average emissivity of the substrate-facing surface is less than about 0.07 or, more specifically, less than about 0.03, or even less than about 0.01. Covers are generally configured in such a way that these emissivity characteristics remain stable over many cycles. In certain embodiments, the initial emissivity changes by less than about 50% after about 10,000 cycles or, more specifically, by less than about 25%, or even by less than about 5%. This stability may be achieved by selecting particularly stable materials for the cover as well as by controlling the roughness of the substrate-facing surface. Without being restricted to any particular theory, it is believed that a rougher surface experiences less emissivity drift than a more polished surface. In certain embodiments, a substrate-facing surface has a surface roughness of between about 0.001 inches and 0.025 inches.

The emissivity values specified above are defined for typical operating temperatures of the pedestal and typical angles at which emissivity is measured. In a radiating body, temperature affects the spectral distribution emitted energy. Thus, the emissivity values provided herein are for the spectral region where emission is the strongest under operating conditions. For example, the emissivity values for wafer-facing surfaces of platens that are at between about 350° C. and 400° C. generally correspond to wavelengths of between about 2 and 8 micrometers and emissivity angles of about 90°. Further, the provided emissivity values are, in the appropriate context, averages or integrals over the wafer-facing surface of a platen. It should be understood that local emissivity values may differ among various points on the surface. For example, platens may develop scratches and/or local discolorations on their wafer-facing surfaces during operation and therefore have localized emissivity peaks. It should be also understood that wafer-facing surfaces of platens may be periodically refinished to bring their emissivity within the specified ranges.

Figure 5B:
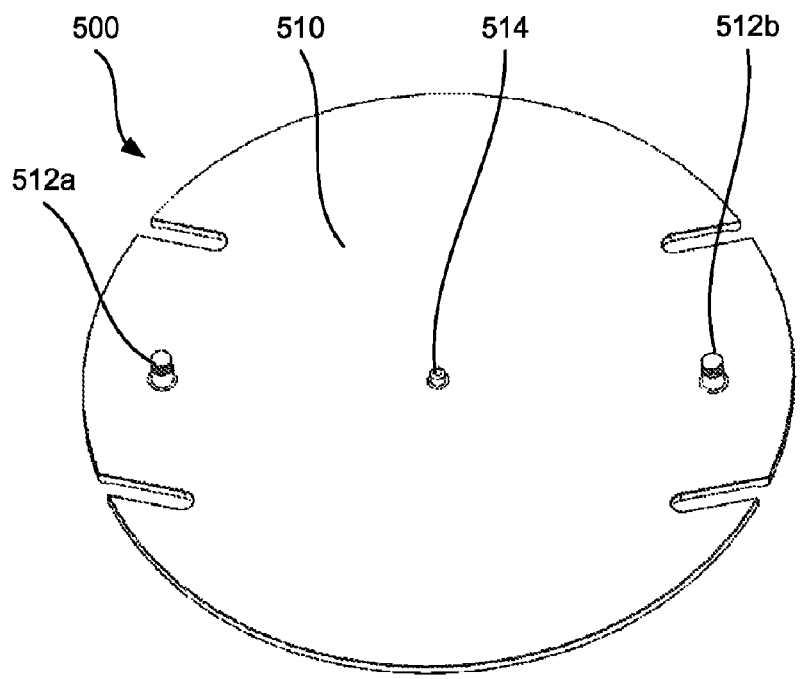
FIG. 5B is a bottom perspective view of the same removable cover that illustrates its platen-facing surface, in accordance with certain embodiments.

FIG. 5B is a bottom perspective view of removable cover 500 that illustrates a platen-facing surface 510, in accordance with certain embodiments. In an assembled pedestal, platen-facing surface 510 may be in contact with the upper surface of the metal platen or positioned at a predetermined distance from the upper surface. The direct contact embodiments have a lower heat transfer resistance but may provide thermal spreading. In the direct contact embodiments, the heat transfer resistance also depends on the roughness of platen-facing surface 510 and the roughness of the upper surface of the platen. In specific embodiments, one or both of these surfaces have a surface roughness of less than 20 micro-inches or, more specifically, less than about 10 micro-inches or, even less than about 5 micro-inches. Furthermore, the uniformity of the heat flux also depends on the two surfaces being substantially parallel, such as within less than about 0.025 inches or, more specifically, less than about 0.010 inches, or even less than about 0.005 inches. In other embodiments, a gap is provided between platen-facing surface 510 and the upper surface of the metal platen by, for example, a set of features positioned on one or both of these surfaces. The gap may be between about 0.001 inches and 0.025 inches or, more specifically, between about 0.005 inches and 0.010 inches.

FIG. 5B also illustrates a guiding pin 514 positioned on platen-facing surface 510 (for example, in the center of cover 500). Guiding pin 514 is configured to protrude into a corresponding guiding recess on the upper surface of the platen and to establish and maintain the relative positions of removable cover 500 and the platen. Guiding pin 514 and the guiding recess may have a tight fit (at room temperature) in order to provide sufficient alignment of the two components. In certain embodiments, a diameter of guiding pin 514 is between about 0.125 inches and 0.5 inches or, more specifically, about 0.25 inches. In the same or other embodiments, the height of guiding pin 514 is between about 0.125 inches and 0.5 inches or, more specifically, about 0.25 inches. Guiding pin 514 may be fabricated as a separate component and then attached to platen-facing surface 510. Alternatively, guiding pin 514 may be an integral part of removable cover 500.

FIG. 5B also illustrates two retaining posts 512a and 512b positioned on platen-facing surface 510. In certain embodiments, two retaining posts are positioned in line with guiding pin 514. A cover designed to support 300-millimeter wafers may have its two retaining posts positioned at between about 4 inches and 5.75 inches from the center of the cover or, more specifically, at between about 4.5 inches and 5 inches (for example at about 4.8 inches). Retaining posts 512a and 512b should be positioned relatively close to the outer edge of removable cover 500 to avoid having side retaining cavities on the metal platen that are too deep. Other arrangements of retaining posts 512a and 512b are possible. Retaining posts 512a and 512b may be fabricated as separate components and then attached to platen-facing surface 510. Alternatively, retaining posts 512a and 512b may be an integral part of removable cover 500.

Fabricating a guiding pin and/or retaining posts as separate components allows more precision during the fabrication of other features, such as the platen-facing surface and substrate-facing surface. For example, one or both of these surfaces may fabricated with more precise roughness specifications or made more flat and/or parallel than would be otherwise possible. A number of different techniques, such as glaze bonding or brazing, may be used for attachment. For example, brazing involves placing some small-grain ceramic material in between two pre-fabricated ceramic components that have large grains. This stack is then subjected to heating and, in certain embodiments, to pressure, in order to melt the small-grain ceramic material and fuse it into the other two components, thereby forming a continuous metallurgical bond.

Figure 5C:
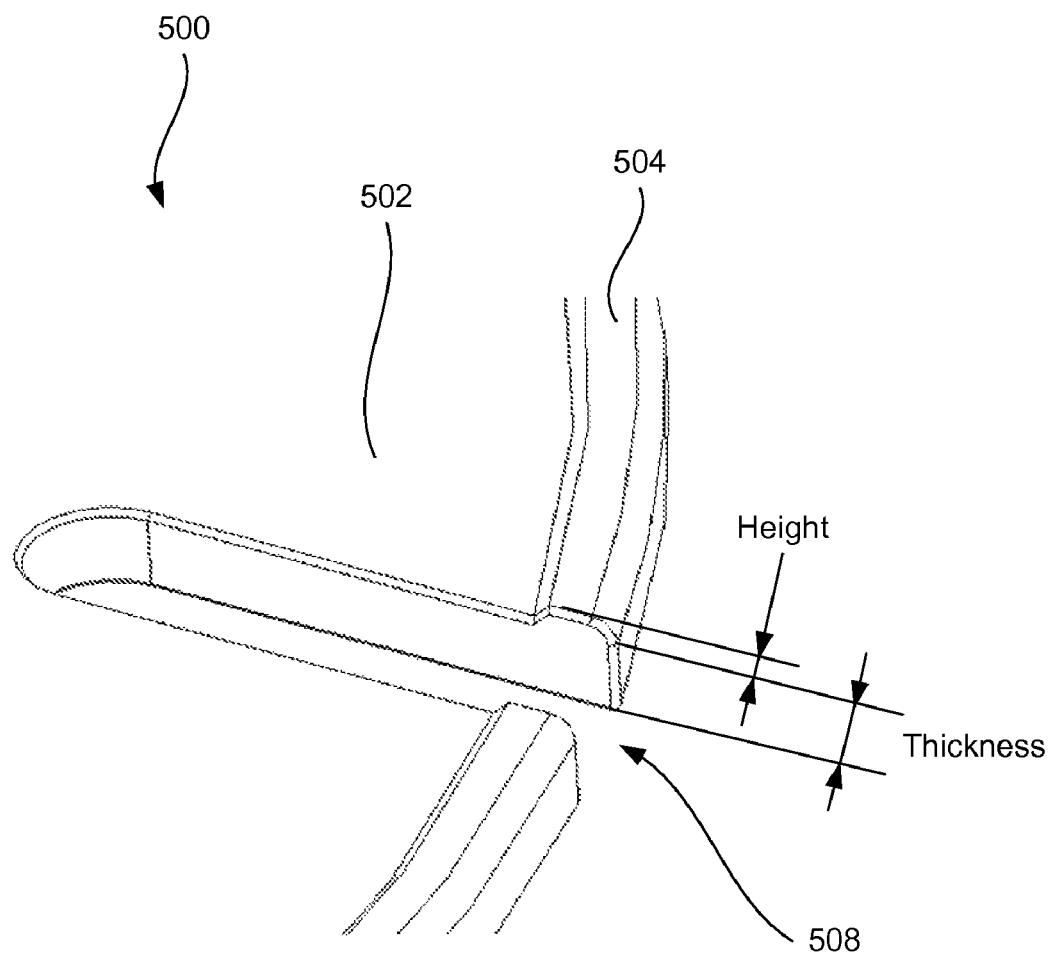
FIG. 5C is an expanded view of an edge portion of the removable cover illustrating various cover edge protrusion features, in accordance with certain embodiments.

Some additional features of removable cover 500, such as its thickness and a profile of the cover edge protrusion (if one is present) will now be described in more detail with reference to FIG. 5C. Specifically, FIG. 5C is a perspective view of an edge portion of removable cover 500, in accordance with certain embodiments. This view illustrates portions of substrate-facing surface 502 and cover edge protrusion 504. It also illustrates recess 508, which allows for viewing some additional features in a cross-section-like representation. For example, a thickness of removable cover 500 may be assessed from this view. The term "thickness" is defined as a distance between substrate-facing surface 502 and the platen-facing surface (not visible). This definition does not account for various protrusions or recesses on these surfaces. In certain embodiments, a thickness of the cover may be between about 0.075 inches and about 0.500 inches or, more specifically, between about 0.125 inches and 0.250 inches (for example, about 0.198 inches). A particular thickness may be selected to meet certain thermal conductivity requirements. For example, when a more thermally resistant material is used for cover construction, the cover may be made thinner than, for example, when less thermally conductive materials are used. The values presented above are applicable for covers made from aluminum oxide or other ceramic materials that are used at process conditions described below. A certain minimum thickness may be needed for fabrication reasons (e.g., fabrication of the cover, bonding of the guiding and retaining pins, and other factors.

FIG. 5C also allows for viewing and assessing a height of cover edge protrusion 504. In certain embodiments, the height is between about 0.010 inches and 0.100 inches or, more specifically, between about 0.025 inches and 0.050 inches (for example, about 0.040 inches). This height should be sufficient to provide support to an edge of the substrate, as described above with reference to FIGS. 4A and 4B. However, the height should not be too excessive so as to avoid damaging this edge. In certain embodiments, cover edge protrusion 504 has a chamfer at the interface with substrate-facing surface 502. The chamfer may help to provide some alignment to a substrate and help with positioning and removing the substrate. In certain embodiments, a chamfer has an angle of between about 30° and 60° with respect to substrate-facing surface 502 (for example, about 45°).

Figure 6A:
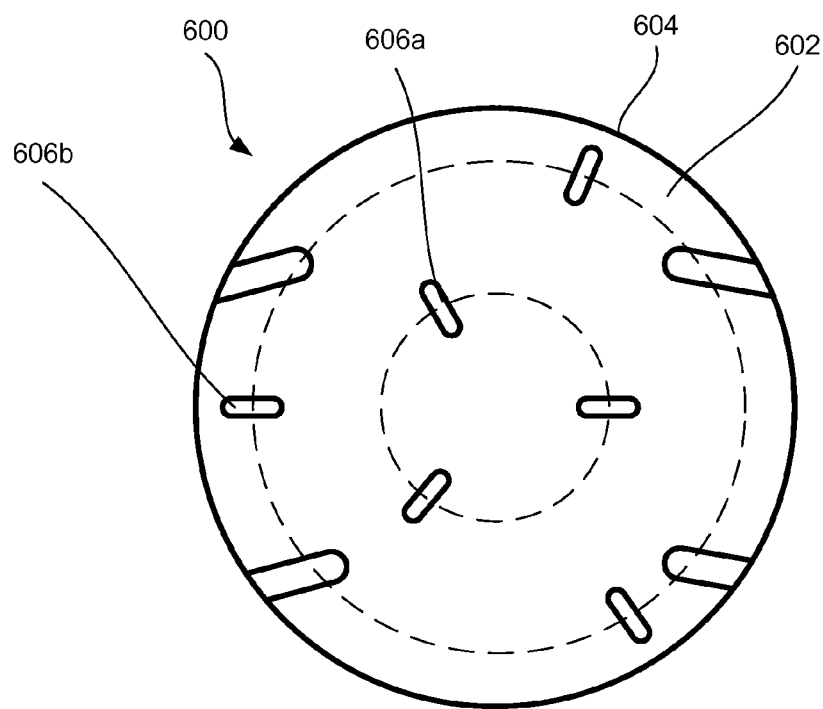
FIG. 6A is a schematic top view of a different cover that illustrates various features on its substrate-facing surface, in accordance with certain embodiments.
Figure 6B:
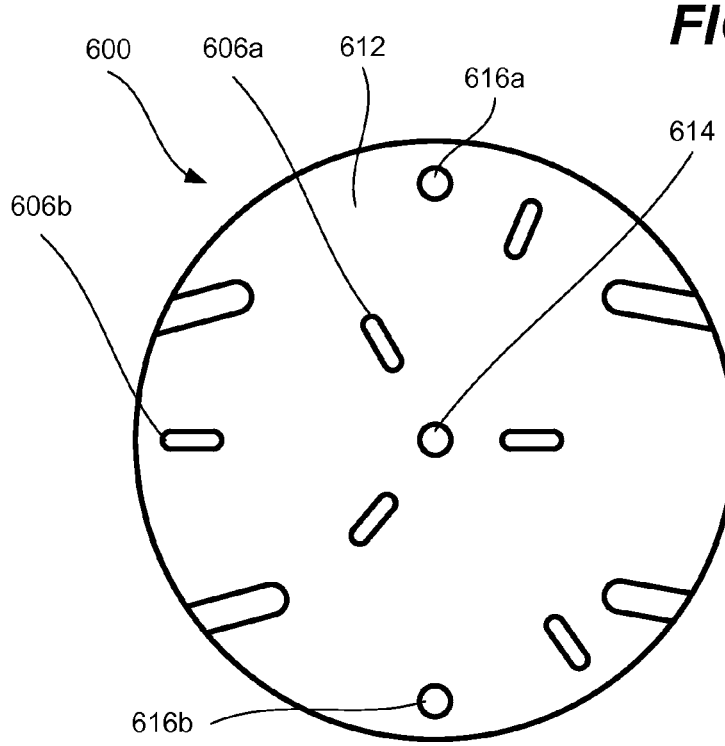
FIG. 6B is a schematic bottom view of this cover that illustrates various features on its platen-facing surface, in accordance with certain embodiments.

FIGS. 6A and 6B are schematic top and bottom views of a different removable cover 600, in accordance with certain embodiments. This removable cover 600 does not have MCA supports on its substrate-facing surface 602 as shown in FIG. 6A. Instead, removable cover 600 has multiple through holes 606a and 606b that allow MCA supports to protrude through removable cover 600 and extend above its substrate-facing surface 602. Through holes 606a and 606b are visible both on substrate-facing surface 602 in FIG. 6A and on platen-facing surface 612 in FIG. 6B. In these embodiments, the MCA supports may be a part of the metal platen or standalone components (e.g., sapphire balls) supported by the metal platen. Because the metal platen may have a much different coefficient of thermal expansion, the MCA supports may move with respect to removable cover 600. For example, a coefficient of thermal expansion for aluminum is about 22.2× $10^{-6}$ m/(m K) and only 5.4×$10^{-6}$ m/(m K) for alumina-based ceramic. Therefore, heating ceramic and aluminum objects that are 6-inch long (which is about a radius of a typical pedestal) from room temperature to about 425° C. (which corresponds to some operating temperatures) would result in about a 0.041 inch extension difference. As such, in certain embodiments, through holes 606a and 606b are formed as slots that are elongated radially with respect to the center of removable cover 600. Through holes 606a and 606b may be arranged along one or more circles (two circles are shown with dashed lined in FIG. 6A). Removable cover 600 may have a cover edge protrusion provided along edge 604. Alternatively, removable cover 600 may have substrate-facing surface 602 that extends all the way to edge 604 and is not enclosed by a cover edge protrusion. Other features of removable cover 600 may be the same or similar to the ones described above with reference to FIGS. 5A-5C. For example, FIG. 6B illustrates platen-facing surface 612 including two retaining posts 616a and 616b and guiding pin 614.

Metal Platen

Figure 7:
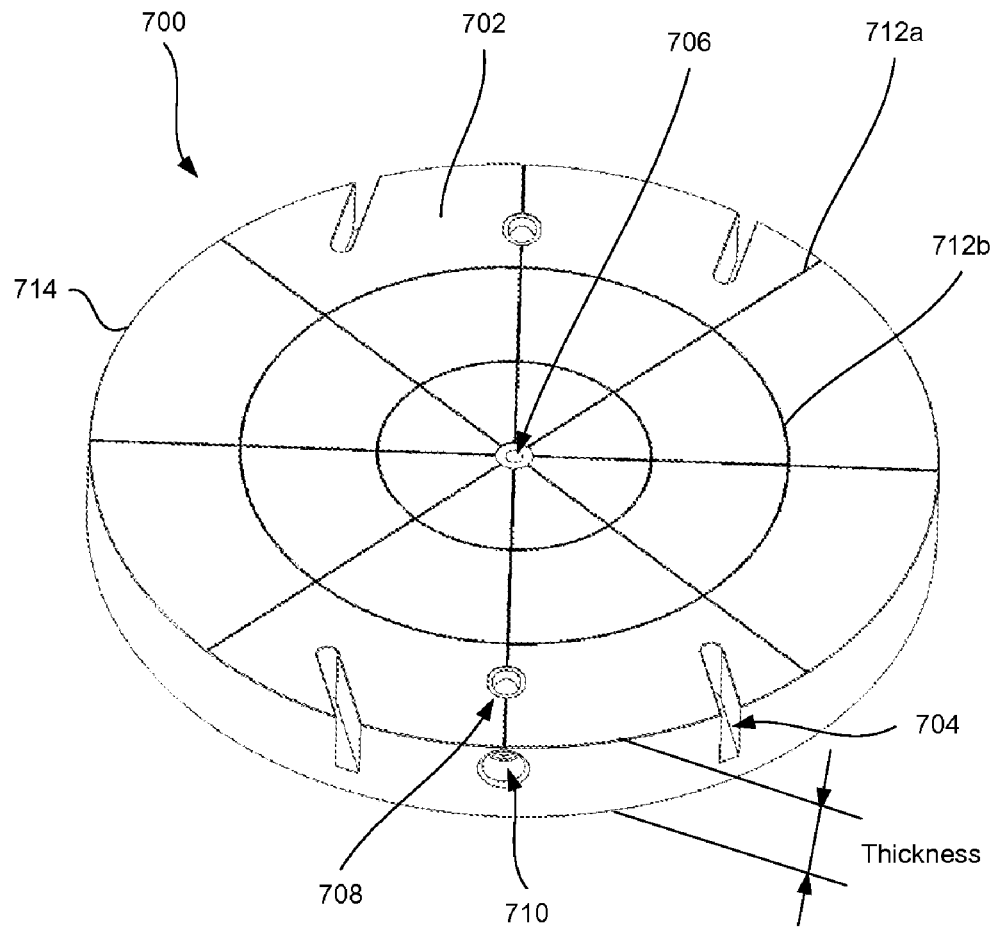
FIG. 7 is a top perspective view of a metal platen that illustrates various features on its upper surface as well as on the side of the platen, in accordance with certain embodiments.

Various features of metal platens will now be described in more detail with reference to FIG. 7. A metal platen may be used to support and deliver heat to a removable cover. A metal platen may be formed as a bulky metal structure providing initial heat distribution from a heating element, which may be attached to the bottom of the platen or positioned within the platen. Specifically, FIG. 7 is a perspective view of a metal platen 700, in accordance with certain embodiments. Metal platen 700 may be constructed from various thermally conductive materials. These materials should also be chemically and thermally resistant in various processing environments. Aluminum may be used for constructing a metal platen (more specifically, aluminum 6061, aluminum 7075, and aluminum 3003). Other grades of aluminum or metals may be used as well. In certain embodiments, a metal platen has a protective coating, such as a hard anodize coating. Certain coatings may be used for upper surface 702 to improve or otherwise control heat transfer between metal platen 700 and a cover. For example, a hard anodize coating may be used to modify the surface roughness and/or emissivity of upper surface 702.

A thickness of metal platen 700 may be at least about 0.5 inches or, more specifically, at least about 1 inch (for example, about 1.4 inches). A thicker platen generally provides more a uniform and stable temperature distribution from a heater. Platen 700 may be configured to maintain its upper surface 702 at a set point of between about between about 100° C. and 450° C. Some operating range examples include a temperature of between about 120° C. and 140° C. (e.g., about 130° C.), between about 280° C. and 320° C. (e.g., about 300° C.), or between about 375° C. and 425° C. (e.g., about 400° C.).

Metal platen 702 also includes multiple recesses 704 for accommodating internal wafer transfer robot fingers or pegs attached to the chamber. During pedestal assembly, recesses 704 are aligned with the corresponding recesses of the cover. Metal platen 700 may also have one or more upper retaining cavities 708 and one or more side retaining cavities 710. Each upper retaining cavity 708 may have a corresponding side retaining cavity 710. The two cavities 708, 710 intersect such that a retaining pin of the cover inserted into upper retaining cavity 708 can be engaged with a retaining key inserted into side retaining cavity 710, as is further explained with reference to FIGS. 8A and 8B. Upper retaining cavities 708 may be shaped as elongated slots extending in the radial direction with respect to the center of the platen 700 to accommodate any thermal expansion differences between the cover and the platen 700. Upper surface 702 also includes a guiding recess 706 for receiving a guiding pin of the cover during assembly of the pedestal. As described above, a combination of the guiding recess 706 and pin is used to provide and maintain alignment of the cover with respect to the metal platen 702.

Upper surface 702 may have one or more outgassing grooves 712a and 712b. These grooves are configured to provide paths to an outside edge 714 of platen 700 from various points on upper surface 702. When a cover is positioned over upper surface 702, small pockets may be formed between upper surface 702 and the platen-facing surface of the cover due to flatness variations between the two surfaces. When a pressure inside the chamber is changed, gases will try to evacuate from these pockets (e.g., during vacuuming of the chamber) or will try to fill these pockets (e.g., when the pressure inside the chamber is increased). This phenomenon is sometimes referred to as the "outgassing" of the pedestal. Outgassing grooves 712a and 712b help to expedite outgassing by providing less obstructed pathways from and to the pockets. Because the positions and sizes of the pockets are hard to predict and may vary over time (e.g., due to deformation of the metal platen and cover caused by temperature, pressure, and other factors), outgassing grooves 712a and 712b may be evenly distributed throughout upper surface 702. A depth of the outgassing grooves may be between about 0.005 inches and 0.025 inches (for example, about 0.015 inches).

In certain embodiments, outgassing grooves may include radial outgassing grooves 712a and concentric outgassing grooves 712b. Specifically, radial outgassing grooves 712a extend to outside edge 714 of platen 700 and provide paths to the chamber environment of the chamber. Radial outgassing grooves 712*a* may or may not pass through the center of platen 700. Specifically, FIG. 7 illustrates eight radial outgassing grooves 712*a* intersecting at the center. These grooves are uniformly spaced apart at about 45°. However, other numbers and configurations of radial outgassing grooves may be used as well.

FIG. 7 also illustrates two concentric outgassing grooves 712*b*. Concentric outgassing grooves 712*b* and radial outgassing grooves 712*a* intersect with each other and provide flow paths for gasses between various locations on upper surface 702 and outside edge 714. For a platen designed to support 300-millimeter wafers, the inner concentric groove may have a diameter of between about 3 inches and 5 inches (for example, about 4 inches). The outer concentric groove may have a diameter of between about 6 inches and 10 inches or, more specifically, between 7 inches and 9 inches (for example, about 8 inches). Overall, the patterns of the grooves should be designed in such a way that the entire upper surface 702 is uniformly covered by grooves and to provide relatively direct flow paths to outside edge 714. Outgassing grooves may be provided on a removable cover in addition or instead of outgassing grooves provided on the metal platen.

Retaining Mechanism

Figure 8A:
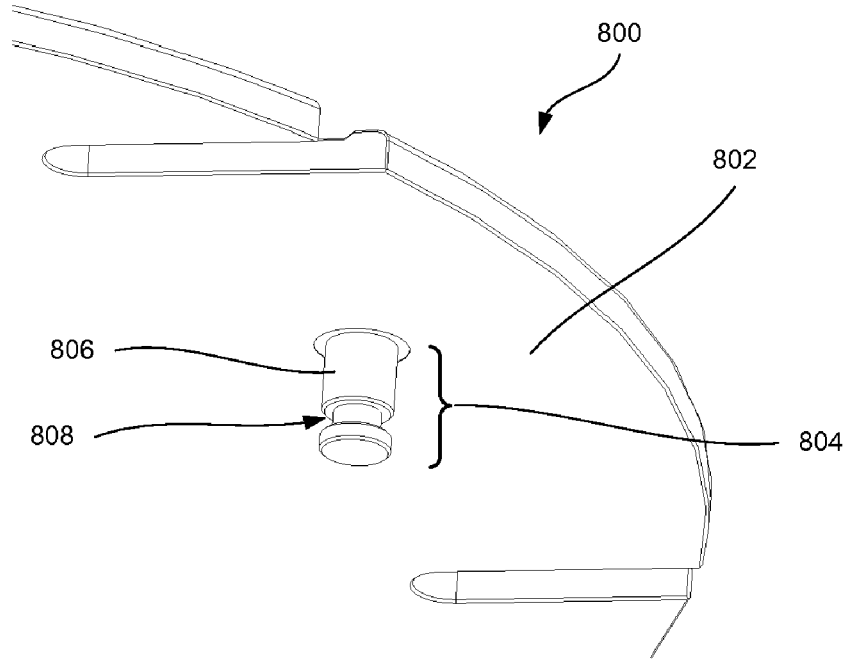
FIG. 8A is a perspective bottom view of a removable cover that illustrates various features of the retaining pin attached to the platen-facing surface of the cover, in accordance with certain embodiments.

Various features of retaining mechanisms will now be described in more detail with reference to FIGS. 8A and 8B. The retaining mechanism is used to support a removable cover with respect to a metal platen during operation and handling of the pedestal and, in certain embodiments, to maintain close contact between these two components. Some support may be also provided by the removable cover weight.

A retaining mechanism may include one or more retaining posts rigidly attached to the platen-facing surface of the cover. Specifically, FIG. 8A is a bottom view of platen-facing surface 802 of cover 800 that illustrates various features of a retaining post 804. Retaining post 804 includes a stem 806, one end of which is attached to platen-facing surface 802. Stem 806 has a circumferential slot 808. A diameter of stem 806 may be between about 0.25 inches and 0.5 inches (for example, about 0.375 inches). A depth of circumferential slot 808 may be between about 0.040 inches and 0.125 inches (for example, about 0.063 inches). A height of stem 806 extending below platen-facing surface 802 may be between about 0.040 inches and 0.125 inches (for example, about 0.060 inches). Retaining post 804, if one is made as a separate component, may also include an attachment head for bonding to platen-facing surface 802 or, more specifically, to a recess in platen-facing surface 802. Platen-facing surface 802 may include two or any other number of retaining posts 804.

Figure 8B:
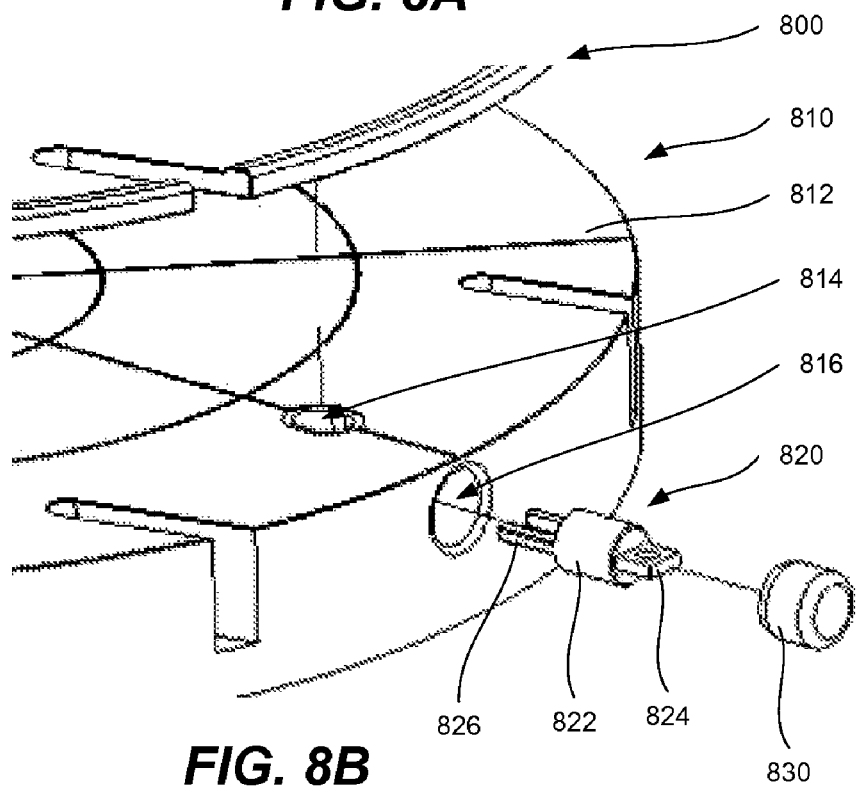
FIG. 8B is a perspective view of an edge portion of the pedestal prior to attaching its cover to its platen that illustrates various components and features of the retaining mechanism, in accordance with certain embodiments.

FIG. 8B is a perspective view of a pedestal illustrating various components and features of the retaining mechanism prior to assembly of the pedestal, in accordance with certain embodiments. Specifically, cover 800 is shown prior to positioning it over upper surface 812 of metal platen 810. For each retaining post (not visible in FIG. 8B) on the platen-facing surface of cover 800, metal platen 810 has an upper retaining cavity 814 and a side retaining cavity 816. Positions of these cavities correspond to positions of the retaining posts. Upper retaining cavity 814 is configured to receive a retaining post. It may be slightly elongated radially (as explained above) to accommodate for differences in thermal expansion of cover 800 and metal platen 810. During assembly, the retaining post protrudes into upper retaining cavity 814 until the circumferential slot of the post is aligned with side retaining cavity 816. In certain embodiments, a retaining post and cavities may be designed in such a way that a circumferential slot of the retaining post is aligned with the center of the side cavity when a platen-facing surface of the cover is in contact with an upper surface of the platen. Pedestal assembly may proceed with inserting a retaining key 820 into side retaining cavity 816. Retaining key 820 includes a body 822, slot engaging lips 826, and an extraction lip 824. During insertion into side retaining cavity 816, slot engaging lips 826 extend through the circumferential slot and engage the retaining post such that it cannot be removed from upper retaining cavity 814. Assembly may continue with inserting a retaining cover 830 into side retaining cavity 816 to prevent retaining key 820 from slipping outside of side retaining cavity 816. Retaining cover 830 and retaining key 820 may be made from the same material as the pedestal to minimize differences in thermal expansion. Retaining cover 830 may have a tight fit with respect to side retaining cavity 816, while retaining key 820 may have a slip fit.

Multi-Station Apparatus Examples

Figure 9:
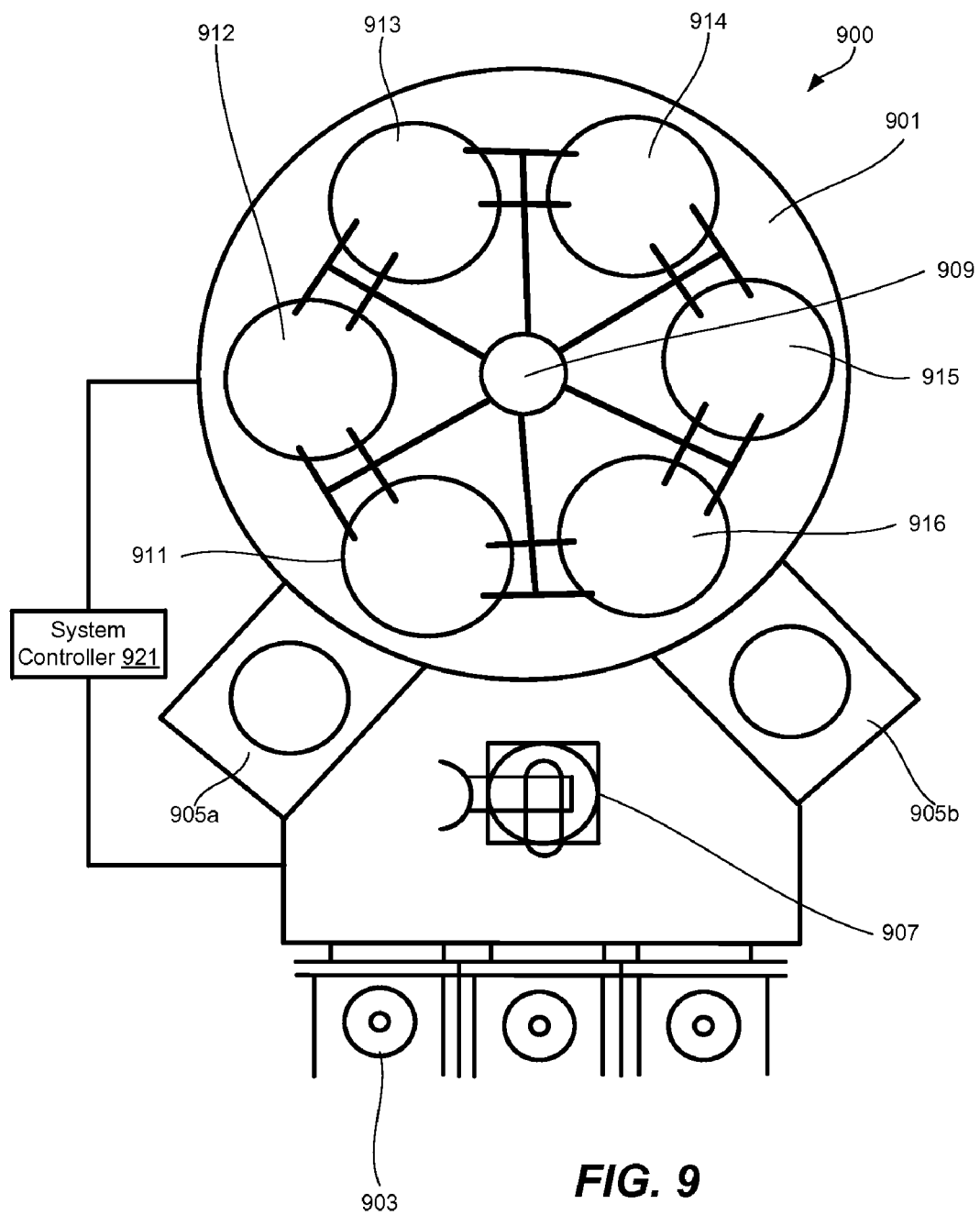
FIG. 9 is a schematic illustration of a multi-station apparatus having multiple pedestals within the same processing chamber, in accordance with certain embodiments.

Various pedestal examples described above may be used in a single station apparatus or a multi-station apparatus. FIG. 9 is a schematic illustration of a multi-station apparatus 900, in accordance with certain embodiments. Apparatus 900 includes a process chamber 901 and one or more cassettes 903 (e.g., Front Opening Unified Ports) for holding wafers to be processed and wafers that have completed the strip process. Processing chamber 901 may have a number of stations, for example, two stations, three stations, four stations, five stations, six stations, seven stations, eight stations, ten stations, or any other number of stations. The number of stations in usually determined by the complexity of the processing operations and the number of these operations that can be performed in a shared environment. FIG. 9 illustrates a process chamber 901 that includes six stations 911-916. All stations 911-916 in the multi-station apparatus 900 within a single process chamber are exposed to the same pressure environment. However, each station 911-916 may have individual local plasma conditions as well as individual local heating conditions achieved by dedicated plasma generators, heaters, and platen configurations.

A semiconductor substrate to be processed in apparatus 900 is loaded from one of the cassettes 903 through one or both load-locks 905*a* and 905*b* into the station 911. An external robot 907 may be used to transfer the substrate between the cassette 903 and load-locks 905*a* and 905*b*. In the depicted embodiment, there are two separate load locks 905*a* and 905*b*. Load locks 905*a* and 905*b* are used to transfer substrates between one pressure environment (e.g., an atmospheric pressure outside of process chamber 901) and another pressure environment (e.g., a much lower pressure inside process chamber 901). Once the pressure is equilibrated to a level corresponding to the internal environment of process chamber 901, another transferring device (not shown) may be used to move the substrate from load-lock 905*a* onto the station 911. The same or another transferring device may be used to move a substrate from station 916 back into load lock 905*b* for removal from processing chamber 901. An internal robot 909 may be used to transfer substrates among processing stations 911-916. Internal robot 909 may include a spindle assembly having multiple arms extending towards processing stations. Each arm may have four fingers (e.g., two fingers on each side of the arm extending towards the stations). These fingers are used to lift, lower, and position substrates within the processing stations.

Before a substrate is positioned onto station 911, the corresponding arms of the internal robot 909 are positioned such that four fingers (i.e., two fingers on each side of the two adjacent arms positioned on opposite sides of station 911) reside within the recesses of the platen and/or removable cover. As explained above, these recesses are adapted for receiving such fingers. The fingers may then be lifted from the recesses of station 911 to support the substrate above station 911 and to move the substrate onto another station. Accordingly, the recesses of other stations are also configured for receiving these fingers. Overall, the recesses of any station are configured to receive any sets of fingers of internal robot 909. Internal robot 909 and the pedestals of stations 911-916 are configured to move vertically with respect to each other in order to raise the substrate above the pedestals' surfaces or to position the substrate onto the pedestal surface. It would be understood by one having ordinary skills in the art that positioning the substrate onto the pedestal's surface may or may not involve a direct contact between substantial portions of these components. For example, a pedestal may be equipped with a MCA support to prevent excessive contact with the back side of the substrate. For purposes of describing overall semiconductor processing apparatus embodiments and processing embodiments, the substrate is said to be positioned on the pedestal even though it is supported by the MCA supports. Furthermore, internal robot 909 and the pedestals of stations 911-916 are configured to move rotationally with respect to each other in order to move substrate from one station to another. Since all stations are present in the same environment, there is no need for load locks or other types of transfer ports in between the stations. One substrate may be processed (including heating) on each station or a selected sub-set of stations.

One station (e.g., station 911) may be reserved for the initial heating of the newly received substrate wafer. This station may be equipped with a heating lamp positioned above the station. The initial temperature of the substrate may be around room temperature (e.g., about 25° C.). The temperature after this pre-heating operation may exceed 300° C. and is generally determined by the subsequent operation, such as crust stripping or bulk stripping.

Other stations (e.g., stations 912, 913, 914, 915, and 916) may be used for other types of processing. Processing on multiple stations in the apparatus may be performed sequentially or in parallel. In certain embodiments, all or some selected processing stations of apparatus 900 may have pedestals with removable covers. As noted above, some or all of the processing stations may be provided with its own Radio Frequency (RF) power supply, such as a downstream inductively coupled plasma RF source. These stations may also be equipped to apply a bias to a substrate positioned on the pedestal surface. Furthermore, some or all of the platens may be equipped with a heating element.

Different stations may have pedestals at different vertical positions with respect to internal robot 909. For example, stations 912 and 913 may have their pedestals residing in lowered positions to have lower heat transfer fluxes from these pedestals. These stations may be used, for example, to remove an implant crust from a photoresist. Thus, there may be a gap between the substrates and pedestals (e.g., removable covers) during this operation to keep the substrates at lower temperatures than during other operations performed on other stations. This gap may be between about 0.1 inches and 3 inches or, more specifically, between about 1.5 inches and 2.5 inches. The gap may be selected and/or adjusted during processing based on one or more factors, such as the emissivity of a wafer-facing surface of the platen, temperature of the platen, initial temperature of the wafer when it is transferred to the station, wafer temperature requirements during the operation, thermal budget of the wafer, resistivity of the wafer, type of the photoresist on the substrate, and other process parameters. A lowered position of the pedestal is defined as any position where the pedestal (i.e., its substrate-facing surface or MCA supports) is not in the contact with the substrate. These differences in the vertical orientations of the pedestals (i.e., between the raised and lowered positions) allows for achieving different substrate temperatures while maintaining substantially similar pedestal heating configurations (both in terms of the pedestals' structures and heating elements' output). Alternatively, different stations may have different types of pedestals or, more specifically, different types of covers. For example, pedestals of station 912 and 913, where lower substrate temperatures are needed, may be equipped with thicker substrate covers. In the same or other embodiments, these pedestals may have covers made from less thermally conductive materials. Furthermore, the heaters' outputs may be controlled to achieve different substrate temperatures. In certain embodiments, various combinations of these techniques (i.e., the pedestals' vertical positions, removable covers' heat transfer characteristics, and heaters' outputs) may be used to control substrates' temperatures.

Some examples of an HDIS strip process using multi-station apparatus 900 will now be briefly described. Further details of the process are provided below with reference to FIG. 11. A substrate is first positioned on station 911, with its pedestal in a raised position, and heated to a temperature of between about 120° C. and 140° C. In certain embodiments, the pedestal of this station does not have a removable cover and substrates are positioned in direct contact with the metal platen. In other embodiments, the pedestal of this station has a removable cover that is highly thermally conductive relative to the other covers used on other pedestals. When the substrate is moved to station 912 and then to station 913, the pedestals of these stations are in lowered positions so that the substrate does not contact these pedestals and the heat transfer is minimized. Alternatively, one or both pedestals of stations 912 and 913 may be raised during a part of or the entire processing. For example, these pedestals may be equipped with relatively thick, highly temperature resistant covers that substantially limit heat transfer. In certain embodiments, these pedestals are configured to maintain the temperature of the substrate at the same level (e.g., between about 120° C. and 140° C. reached on station 911).

Then the substrate is moved station 914 to start bulk stripping. The substrate temperature may need to be increased to at least about 250° C. or, more specifically, to about 280° C. The pedestal of this station may be in a raised position, such that a removable cover is in contact with the substrate. Also, this pedestal may be equipped with a removable cover having good heat transfer properties.

In certain embodiments, an apparatus is used to process different substrate types. For example, the same apparatus may be used to strip "un-crusted" photoresist, which generally requires high-temperature conditions, and crusted photoresist, which needs lower temperature conditions. To switch between these different temperature operating regimes, pedestal covers may be changed for more precise control. This structural change of the apparatus may be coupled with changes in heater outputs and/or the vertical position of the pedestal.

In certain embodiments, a system controller 921 is used to control process conditions for various operations of the stripping process described below. For example, system controller 921 may control positions of the pedestals in each station 911-916 as well as their heater outputs. System controller 921 may receive input from various sensors (e.g., thermocouples measuring temperatures of the pedestal, substrate, and other components) as well as from a user interface (e.g., specifying types of covers used on each pedestal). System controller 921 typically includes one or more memory devices and one or more processors. The processor may include a central processing unit (CPU) or computer, analog and/or digital input/output connections, stepper motor controller boards, and the like.

System controller 921 may control some or even most of the activities of apparatus 900. For example, system controller 921 may execute system control software including sets of instructions for controlling the timing of various processing operations, pedestal positions of stations 911-916, substrate and pedestal temperatures, pressure inside chamber 901, and other process parameters. Other computer programs may be stored on memory devices associated with system controller 921. These programs may be used for various processing and maintenance tasks. The computer program code for controlling the processing operations can be written in any conventional computer readable programming language: for example, assembly language, C, C++, Pascal, Fortran, or others. Compiled object code or script is executed by the processor to perform the tasks identified in the program.

In certain embodiments, system controller 921 has a user interface associated with it. The user interface may include a display screen, graphical software displays of the apparatus and/or process conditions, and user input devices such as pointing devices, keyboards, touch screens, microphones, and the like.

The controller parameters relate to process conditions such as, for example, timing of the processing steps, flow rates and temperatures of precursors and other process gases, temperature of the substrate (as controlled by, for example, the position of a pedestal with respect to the substrate and/or the energy/power delivered to the pedestal), pressure of the chamber, and other parameters of a particular process. These parameters are provided to the user in the form of a recipe and may be entered utilizing the user interface.

The system software may be designed or configured in many different ways. For example, various chamber component subroutines or control objects may be written to control operation of the chamber components necessary to carry some operations described herein. Examples of programs or sections of programs for this purpose include substrate timing of the processing steps code, flow rates and temperatures of precursors and other processing gases code, and a code for pressure of the chamber.

The system controller 921 may receive input from the user interface (e.g., an operator entering process parameters, such as a substrate type, temperature requirements, and duration of various stripping operations) and/or various sensors (e.g., thermocouples measuring substrate and platen temperatures, radiation measuring devices, sensors registering positions of a substrates and a platen, pressure measuring devices, and others). The system controller 921 may be connected to actuator mechanisms of each station 911-916 inside the processing chamber 901 and configured to control positions (e.g., raised, lowered, intermediate, variable, or any other position) of each platen based on the input provided to the system controller 911. Various control recipes are presented in the description of the stripping process and other parts of this document. For example, the system controller 921 may receive input that indicates that the next substrate to be processed on station 912 has low-resistivity and that a HDIS striping method should be used. The system controller 921 may verify certain process conditions from one or more sensors (e.g., the temperature of the next substrate as it is received on a platen of the station 912, a temperature of the platen, or substrate resistivity). The system controller 921 may determine that based on all available input, the pedestal should be in a lowered position and may verify the current position of the pedestal. The system controller 921 may then instruct the actuator of the station 912 to move the pedestal into the lowered position. Further, receiving input and adjusting the positions of pedestals may be a dynamic process. The system controller 921 may continuously receive input (e.g., a temperature of a substrate) and readjust the positions of the pedestals throughout operations in order to control substrates' temperatures with greater precision.

Multi-Chamber Apparatus Example

Figure 10:
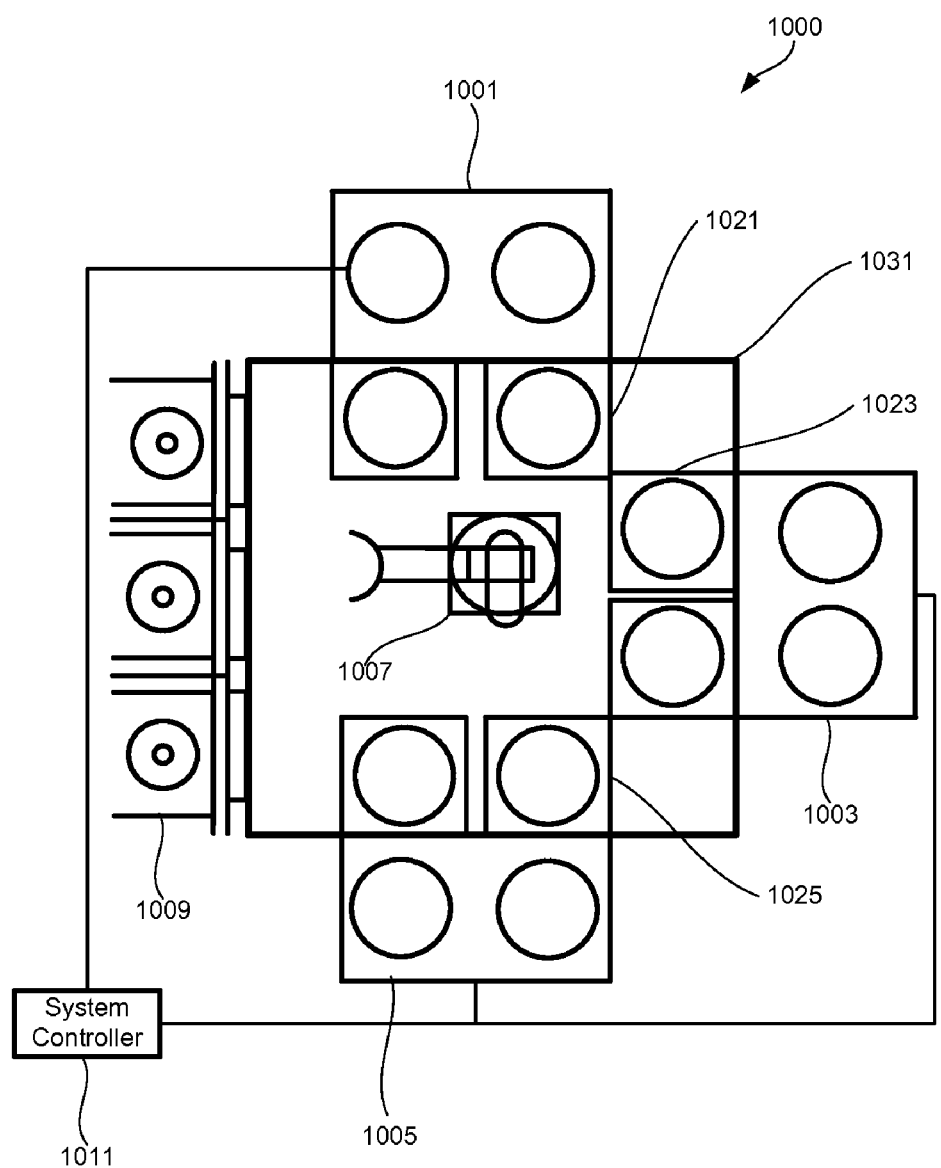
FIG. 10 is a schematic illustration of a multi-chamber apparatus having pedestals positioned in different chambers, in accordance with certain embodiments.

FIG. 10 is a schematic illustration of a multi-chamber apparatus 1000 that may be equipped with pedestals having removable covers, in accordance with certain embodiment. Apparatus 1000 may have three separate chambers 1001, 1003, and 1005 (as shown) or any other number of chambers. Each chamber 1001-1005 has its own pressure environment, which is not shared with other chambers. For example, chamber 1001 may operate at a different pressure level than chambers 1003 and 1005 or have different chemical composition in its environment. This provides additional processing flexibility, but also requires transferring substrates through transfer ports between different operating environments in order to prevent cross-contamination between these environments. Specifically, FIG. 10 illustrates each chamber having two load locks (i.e., chamber 1001 having a set of load locks 1021, chamber 1003 having a set of load locks 1023, and chamber 1005 having a set of load locks 1025). It should be understood that any number of load locks may be used for each individual chamber. Load locks 1021-1025 may be exposed to an intermediate environment 1031, which may be different than the ambient environment of the storage cassettes 1009, and be separated from storage cassettes 1009 by a set of load locks (not shown). Furthermore, one or more chambers 1001-1005 may share its environment with intermediate environment 1031 and, therefore, one or more corresponding load lock sets 1021-1025 may be omitted or kept open on both sides.

FIG. 10 shows each chamber equipped with two stations. However, any number of stations may be used. In one embodiment, one or more chambers of the multi-chamber apparatus may be similar to the six-station examples described above with reference to FIG. 9. Each chamber does not have to have the same number of stations. One or more stations of multi-chamber apparatus 1000 have pedestals with removable covers as described above. In certain embodiments, all the stations in one of the chambers or in all chambers have pedestals with removable covers.

Multi-chamber apparatus 1000 may also have a shared substrate handling robot 1007 for transferring wafers between load locks 1021-1025 and one or more cassettes 1009 or some other components. Each chamber, and even each individual station, may be controlled by a system controller 1011, which may be configured similar to the ones described above with reference to FIG. 9.

Processing Examples

Figure 11:
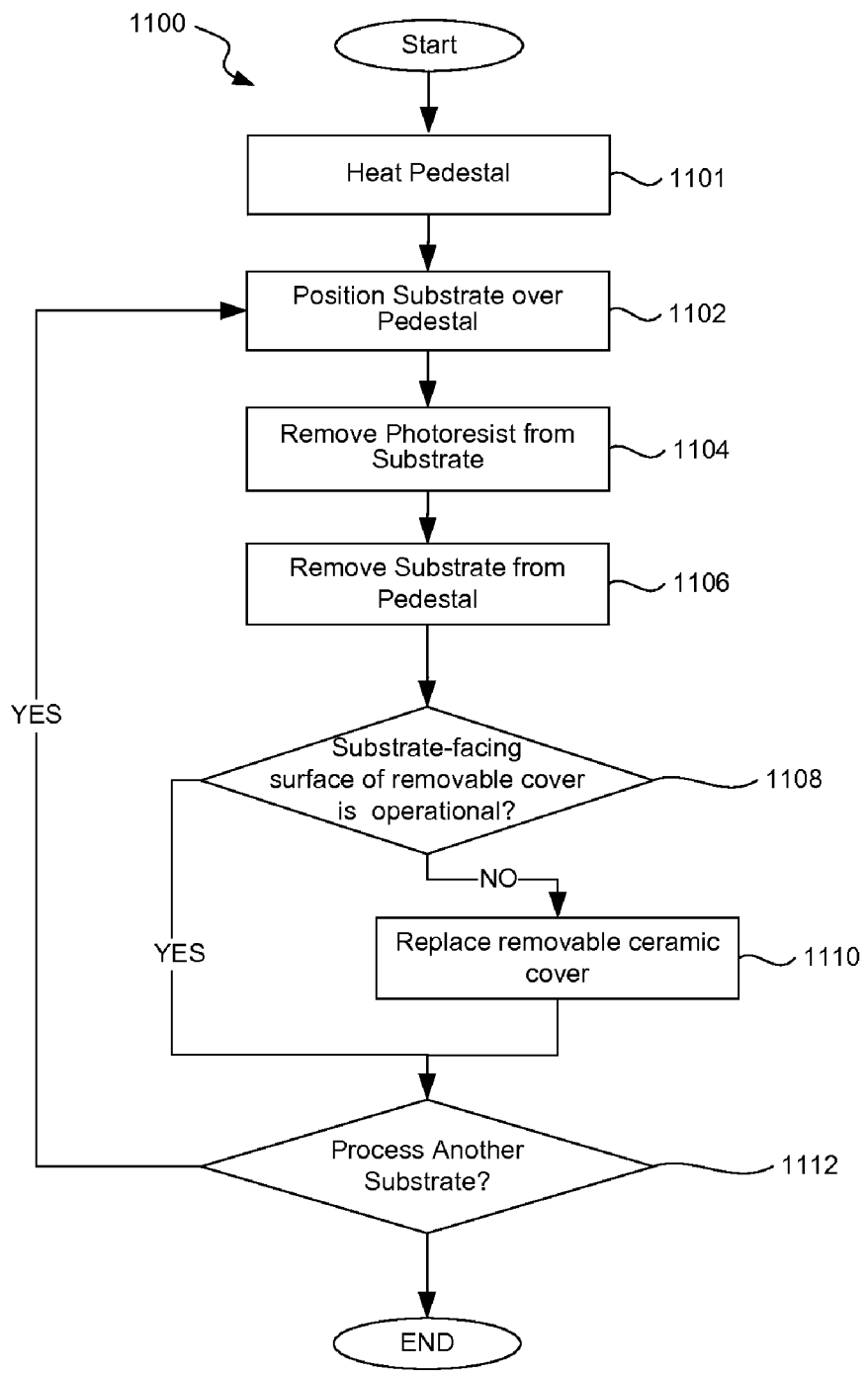
FIG. 11 is a process flowchart corresponding to a method for stripping photoresist from semiconductor substrates, in accordance with certain embodiments.

FIG. 11 illustrates a process flowchart corresponding to various methods of stripping photoresist from semiconductor substrates, in accordance with certain embodiments. This description provides additional context for various features of pedestals having removable covers. Process 1100 may start with heating a pedestal to a predetermined temperature in operation 1101. In certain embodiments, the pedestal is heated to at least about 200° C. or, more specifically, to at least about 300° C. After this operation, a substrate-facing surface of the pedestal, such as a substrate-facing surface of the pedestal cover, may have a temperature variation of less than about 2° C. over the entire surface or, more specifically, less than about 1° C.

Process 1100 may continue with positioning a substrate over the heated pedestal in operation 1102. In certain embodiments, the substrate surface includes low-k dielectric materials or other materials employed in Back End of Line (BEOL) processing. Alternatively, the surface may include silicon (e.g., single crystalline and/or polysilicon) or other materials used in Front End of Line (FEOL) processing.

The pedestal may be in the raised position and be used to support the wafer (either by a direct contact with the substrate-facing surface or a direct contact with a MCA support or both). Alternatively, the pedestal may be in a lowered position and the wafer supported, for example, by fingers of the wafer transfer robot. As indicated above, the temperature of the pedestal, the type of the removable cover, and the vertical position of the pedestal are determined by the temperature requirements of the substrate, which may be different for bulk stripping and HDIS stripping.

Process 1100 then proceeds with removing some or all of the photoresist from the substrate in operation 1104. The pedestal may be retained in the original position or may be adjusted during this operation to achieve more precise temperature control. Plasma may be used to assist with stripping the photoresist. An inert gas may be used, for example, along with an oxidizing agent, such as oxygen, carbon dioxide, carbon monoxide, carbon tetra-fluoride. Any known plasma source may be used, such as RF plasma, DC plasma, microwave plasma, or any other known plasma source. In a preferred embodiment, a downstream RF plasma source is used. Typically, the RF plasma power for a 300 mm wafer ranges between about 300 Watts to about 10 Kilowatts. In a preferred embodiment, the RF plasma power is between about 3000 Watts and 6000 Watts. The process chamber may be kept at a pressure of between about 300 mTorr to 2 Torr or, more specifically, between about 0.9 Torr and 1.1 Torr. Wafer temperatures may be kept at between about 220° C. and about 300° C.

Process 1100 may proceed with removing the processed substrate from the pedestal in operation 1106. For example, a set of fingers of the internal robot that were residing within the pedestal recesses during processing may raise the substrate and move it to another station or deliver it to another transferring mechanism for removal from the chamber.

Process 1100 may involve periodic inspection of the substrate-facing surface of the pedestal to determine any temperature variations, discolorations, and/or contamination. This inspection may be performed after processing a certain predetermined number of substrates or after each wafer. For example, one or more thermocouples may provide feedback to the system controller about temperature conditions of the substrate-facing surface.

Temperature measurements may be performed by any suitable device including a thermocouple, a pyrometer, an emissometer that measures the infrared radiation coming off the wafer, and the like. Generally, a no-contact temperature measuring device is used to avoid tainting or damaging the wafer. If a contact device is used, it may be contact the underside or edge of the wafer rather than the topside. In a particular embodiment, a blackbody may be placed next to the wafer, with a thermocouple in the blackbody to monitor temperature. In certain embodiments, one or more thermocouples are suspended or supported near the wafer. Multiple thermocouples placed at different points may used to supply additional temperature information. The thermocouple outputs a direct voltage that is an indicator of temperature.

As indicated, the temperature sensing device sends wafer temperature information to a controller, generally in the form of an output voltage. The controller analyzes the data and, in turn, sends instructions to a linear motor to modulate the wafer-pedestal gap and keep the temperature at the desired level. In general, accurate feedback control with small overshoot is necessary. In certain embodiments, the controller is programmed with Proportional Integral Derivative (PID) algorithms for stable and accurate control. In certain embodiments, the motor used to move the pedestal and/or wafer support is a servo controlled linear actuator motor, which receives instructions for a prescribed motion based on input from the thermometry equipment. The motor may have embedded logic circuitry to support the PID closed loop algorithms for gap variance.

Process may include a periodic check for one or more predetermined parameters (block 1108), which may trigger replacement of the removable cover may be replaced in operation 1110. Certain aspects of this replacement operation are described above with reference to FIGS. 8A and 8B. It should be noted that a cover removed from the pedestal may be further reworked and introduced back into the process. For example, the substrate-facing surface of the cover may be polished to achieve suitable characteristics, such as emissivity.

Process 1100 may continue with an inquiry 1112 as to whether additional wafers need to be processed. If so, operations 1102-1110 may be repeated as described above. It should be noted that some process conditions may be different in this new cycle. In fact, the removable cover may be replaced in the previous operation 1100 specifically to change to or to adapt to new process conditions.

In some embodiments, the stripping apparatus may also be used in stripping processes associated with a PLAD (Plasma Assisted Doping) process, which provides very high concentrations (e.g., $1 \times 10^{16}$ cm$^{-2}$ or more) of dopant (typically boron, arsenic, or phosphorous). Higher concentrations make it more difficult to remove crust because dopants that are trapped in the crust are generally less volatile than the oxidized photoresist material. Sometimes, a fluorine-containing compound is added to the plasma to enhance the removal process. In other examples, the substrate is exposed to the first plasma formed from oxygen and a forming gas. The forming gas may include hydrogen (e.g., between about 0.5 and 10 molar percent or, more specifically, between about 4 and 6 molar percent, or, even more specifically, about 5 molar percent). This method may also include a step of forming a thin oxide on the substrate using the oxygen and forming gas in the first plasma. The oxide may be sufficiently thick to prevent or, at least, minimize the loss of silicon when the substrate is exposed to fluorine radicals. For example, the oxide may be between about 0 and 5 nanometers thick or, more specifically, between about 0 and about 2 nanometers.

The forming gas in the first plasma serves as a reducing agent to reduce the crust of the photoresist. In particular, the hydrogen quite effectively reduces boron oxide to more volatile species via the mechanism:

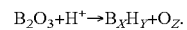

$$B_2O_3 + H^+ \rightarrow B_XH_Y + O_Z.$$

These volatile species can be more easily removed from the semiconductor substrate than the un-reduced crust. In certain embodiments, the first plasma includes an oxygen-to-forming gas ratio of between about 0:1 and 1:0 or, more specifically, between about 1:19 and 19:1 (for example, about 4:1).

After the semiconductor substrate has been exposed to the first plasma for a time sufficient to remove a portion of the photoresist and permit an oxide layer to form on the substrate, the substrate is then subjected to a second plasma. In certain embodiments, the second plasma is formed from oxygen, a forming gas or an inert dilutant (such as, for example, nitrogen or helium), and a fluorine-containing gas that serves as a source of fluorine radicals. The fluorine-containing gas can be nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. In certain embodiments, the second plasma is formed from oxygen, forming gas or nitrogen, and $CF_4$. In certain embodiments, the second plasma is formed from oxygen present in the range of about 10% to about 100%, forming gas or nitrogen present in the range of about 0% to about 50%, and $CF_4$ present in the range of about 0% to about 20%. In more specific embodiments, the second plasma is formed from oxygen, forming gas or nitrogen, and $CF_4$ in a ratio of oxygen:forming gas or nitrogen:$CF_4$ of about 16:2:0.05. Forming gas may allow for more accurate control of silicon loss because the hydrogen bonds with fluorine radicals. The second plasma removes the photoresist residue and, at a much slower rate, the thin oxide layer while minimizing the silicon consumed during the second plasma process.

In certain embodiments, the semiconductor substrate is maintained at or heated to a temperature in the range of about 16° C. (i.e., room temperature) to about 300° C. during exposure to the second plasma. The time during which the semiconductor substrate is exposed to the second plasma is a function of the thickness of the photoresist residue after the first plasma process. The semiconductor substrate is also maintained at a pressure in the range of about 1 mTorr to about 1 Atmosphere and preferably about 0.1 Torr to about 10 Torr. It will be understood that exposure to the first plasma and exposure to the second plasma can be performed as two discrete steps, for example, with a purge step performed therebetween, or can be performed as one continuous plasma flow step with the composition of the continuous plasma flow changing from the composition of the first plasma to the composition of the second plasma. Overall, a removable cover of the pedestal is made from one or more materials resistant to the processing environments describe above.

Patterning Method/Apparatus Examples

The apparatus/process described herein above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following steps, with each step enabled with a number of possible tools: (1) application of photoresist on a workpiece (i.e., substrate) using a spin-on or spray-on tool; (2) curing of photoresist using a hot plate, furnace, or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Experimental Results

Figure 12:
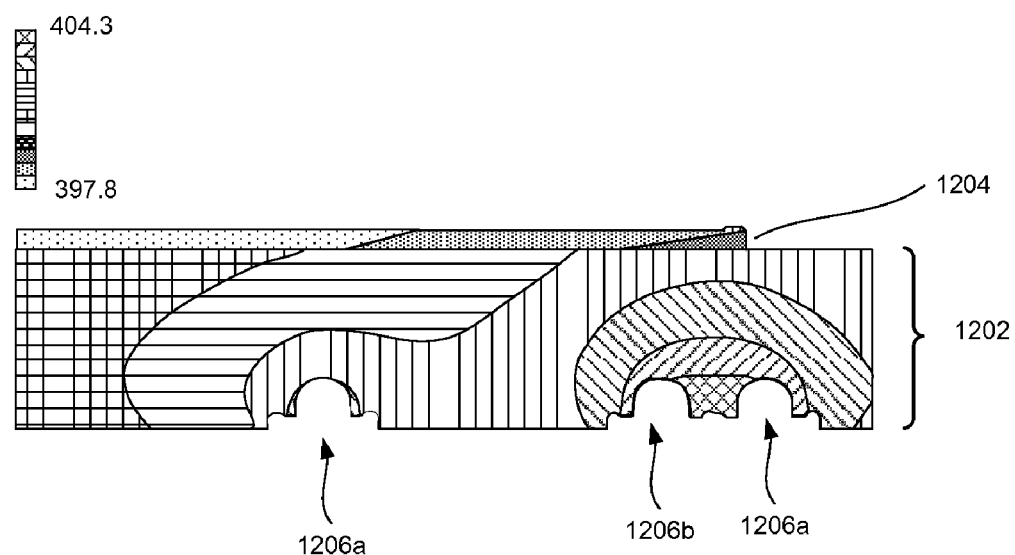
FIG. 12 is a thermal map obtained during thermal modeling of a pedestal that includes an aluminum platen and a removable ceramic cover.

That a ceramic cover positioned over an aluminum pedestal has proved to be an effective thermal spreader is supported by the experimental results presented in FIG. 12. Specifically, FIG. 12 illustrates a thermal map of these two components during a modeled thermal steady state. Cover 1204 was made from 99.9% pure aluminum oxide. Its thickness was 0.198 inches. Pedestal 1202 was made from aluminum 6061. Its thickness was 1.395 inches. Protrusions 1206a, 1206b, and 1206c illustrate positions of the heating elements. The model was created for a set temperature of 400° C.

The results show that a large portion of the substrate-facing surface of cover 1204 was at 397.8° C., while a smaller outer edge portion was at 398.4° C. At the same time, an upper surface of pedestal 1202 was evenly divided into a 401.1° C. zone, 401.6° C. zone, and 402.2° C. zone. Without being restricted to any particular theory, it is believed that the temperature profile of the upper surface may have been even less uniform if cover 1204 was not used. It is believed that cover 1204 may have also helped with heat distribution in the upper surface of the pedestal 1202. Overall, these results indicate that the addition of a cover provides a much more uniform temperature profile of the substrate-facing surface than does a pedestal without a cover.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A pedestal for supporting a semiconductor substrate in an apparatus for processing the semiconductor substrate, the pedestal comprising:
    a metal platen comprising an upper surface for providing heat to the semiconductor substrate;
    a removable ceramic cover for providing substantially uniform heat transfer to the semiconductor substrate positioned over a substrate-facing surface of the removable ceramic cover during processing of the semiconductor substrate in the apparatus, the removable ceramic cover positioned over the upper surface of the metal platen; and
    wherein the upper surface of the metal platen comprises a set of supports protruding through openings in the removable ceramic cover, the set of supports configured to support the semiconductor substrate above the substrate-facing surface of the removable ceramic cover at an average predetermined distance.

2. The pedestal of claim 1, wherein the removable ceramic cover comprises a platen-facing surface opposite of the substrate-facing surface, a substantial portion of the platen-facing surface being in direct contact with the upper surface of the metal platen after assembly of the pedestal.

3. The pedestal of claim 1, wherein the removable ceramic cover comprises a platen-facing surface opposite of the substrate-facing surface, the platen-facing surface positioned at a predetermined distance from the upper surface of the metal platen after assembly of the pedestal.

4. The pedestal of claim 1, wherein the metal platen comprises one of more aluminum materials selected from the group consisting of: aluminum 6061, aluminum 7075, and aluminum 3003.

5. The pedestal of claim 1, wherein the metal platen comprises a heater arranged within the metal platen for heating the upper surface of the metal platen to a temperature of between about 100° C. and 450° C.

6. The pedestal of claim 1, wherein the substrate-facing surface comprises a set of supports for supporting the semiconductor substrate above the substrate-facing surface at an average predetermined distance.

7. The pedestal of claim 6, wherein the average predetermined distance is between about 0.004 inches and 0.007 inches.

8. The pedestal of claim 6, wherein the set of supports comprises at least six individual supports arranged in two or more circular patterns centered about a center of the removable ceramic cover.

9. The pedestal of claim 1, wherein the set of supports comprises ceramic balls positioned on free ends of extensions attached to the metal platen.

10. The pedestal of claim 1, wherein the openings have an elongated shape extending radially from a center of the removable ceramic cover.

11. The pedestal of claim 1, wherein the pedestal is configured to maintain a temperature profile of the substrate-facing surface within less than about 3° C. within a set temperature of 400° C.

12. The pedestal of claim 1, wherein the removable ceramic cover has a thickness of between about 0.075 inches and about 0.500 inches.

13. The pedestal of claim 1, wherein the removable ceramic cover has a platen-facing surface parallel to the substrate-facing surface within less than about 0.002 inches deviation.

14. The pedestal of claim 1, wherein the removable ceramic cover comprises one or more materials selected from the group consisting of: aluminum oxide, aluminum nitride, barium titanate, boron nitride, silicon aluminium oxynitride, silicon carbide, silicon nitride, magnesium silicate, titanium carbide, zinc oxide, and zirconium dioxide.

15. The pedestal of claim 1, wherein the removable ceramic cover comprises a guiding pin extending from a center of a platen-facing surface and protruding into a corresponding recess in the upper surface of the metal platen, the guiding pin and the corresponding recess configured to maintain relative positions of the removable ceramic cover and the metal platen.

16. The pedestal of claim 1, wherein the removable ceramic cover comprises two or more retaining posts extending from a platen-facing surface and into respective retaining upper cavities on the upper surface of the metal platen for securing the removable ceramic cover with respect to the metal platen.

17. A pedestal for supporting a semiconductor substrate in an apparatus for processing the semiconductor substrate, the pedestal comprising:
a metal platen comprising an upper surface for providing heat to the semiconductor substrate;
a removable ceramic cover for providing substantially uniform heat transfer to the semiconductor substrate positioned over a substrate-facing surface of the removable ceramic cover during processing of the semiconductor substrate in the apparatus, the removable ceramic cover positioned over the upper surface of the metal platen, wherein the removable ceramic cover comprises two or more retaining posts extending from a platen-facing surface and into respective retaining upper cavities on the upper surface of the metal platen for securing the removable ceramic cover with respect to the metal platen; and
two or more retaining keys extending into side retaining cavities of the metal platen and engaging with the two or more retaining posts of the removable ceramic cover.

18. The pedestal of claim 17, further comprising two or more retaining covers for insertion into the side retaining cavities of the metal platen and covering the two or more retaining keys inside the side retaining cavities.

19. A pedestal for supporting a semiconductor substrate in an apparatus for processing the semiconductor substrate, the pedestal comprising:
a metal platen comprising an upper surface for providing heat to the semiconductor substrate;
a removable ceramic cover for providing substantially uniform heat transfer to the semiconductor substrate positioned over a substrate-facing surface of the removable ceramic cover during processing of the semiconductor substrate in the apparatus, the removable ceramic cover positioned over the upper surface of the metal platen; and
wherein the removable ceramic cover comprises a cover edge protrusion extending above the substrate-facing surface of the removable ceramic cover and configured for capturing an outer edge of the semiconductor substrate during processing of the semiconductor substrate in the apparatus.

20. A pedestal for supporting a semiconductor substrate in an apparatus for processing the semiconductor substrate, the pedestal comprising:
a metal platen comprising an upper surface for providing heat to the semiconductor substrate;
a removable ceramic cover for providing substantially uniform heat transfer to the semiconductor substrate positioned over a substrate-facing surface of the removable ceramic cover during processing of the semiconductor substrate in the apparatus, the removable ceramic cover positioned over the upper surface of the metal platen; and
wherein the metal platen comprises a platen edge protrusion extending above the substrate-facing surface of the removable ceramic cover and configured for capturing an outer edge of the semiconductor substrate during processing of the semiconductor substrate in the apparatus, wherein the removable ceramic cover is positioned within a cavity formed by the platen edge protrusion.

21. The pedestal of claim 1, wherein the substrate-facing surface of the removable ceramic cover has an average emissivity of less than about 0.35.

22. The pedestal of claim 1, wherein a platen-facing surface of the removable ceramic cover and the upper surface of the metal platen have a surface roughness of less than 10 micro-inches.

23. The pedestal of claim 1, wherein the upper surface of the metal platen comprises one or more outgassing grooves.

24. The pedestal of claim 23, wherein the one or more outgassing grooves comprise at least one groove extending radially away from a center of the metal platen.

25. The pedestal of claim 24, wherein the one or more outgassing grooves further comprise at least one concentric groove.

26. The pedestal of claim 23, wherein a depth of the one or more outgassing grooves is between about 0.005 inches and 0.025 inches.

* * * * *